US012558649B2

(12) United States Patent
Stuckenberg et al.

(10) Patent No.: US 12,558,649 B2
(45) Date of Patent: Feb. 24, 2026

(54) ATMOSPHERIC WATER GENERATION SYSTEMS AND METHODS UTILIZING MEMBRANE-BASED WATER EXTRACTION

(71) Applicant: Genesis Systems LLC, Tampa, FL (US)

(72) Inventors: David James Stuckenberg, Tampa, FL (US); Venkateswara Rao Kode, Tampa, FL (US); Erick Keith Went, Camarillo, CA (US)

(73) Assignee: Genesis Systems LLC, Tampa, FL (US)

( * ) Notice: Subject to any disclaimer, the term of this patent is extended or adjusted under 35 U.S.C. 154(b) by 660 days.

(21) Appl. No.: 17/811,236

(22) Filed: Jul. 7, 2022

(65) Prior Publication Data

US 2023/0010090 A1      Jan. 12, 2023

Related U.S. Application Data

(60) Provisional application No. 63/203,063, filed on Jul. 7, 2021.

(51) Int. Cl.
B01D 53/26      (2006.01)
B01D 53/14      (2006.01)
(Continued)

(52) U.S. Cl.
CPC ....... B01D 53/263 (2013.01); B01D 53/1425 (2013.01); B01D 53/18 (2013.01);
(Continued)

(58) Field of Classification Search
CPC .. B01D 53/263; B01D 53/1425; B01D 53/18; B01D 61/364; E03B 3/28; H01L 25/162;
(Continued)

(56) References Cited

U.S. PATENT DOCUMENTS 4,470,405  A       9/1984  Landstrom et al.
4,475,031  A  *  10/1984  Mockovciak, Jr. ........................
                                                        G02F 1/13318
                                                        349/16
(Continued)

FOREIGN PATENT DOCUMENTS

CN          203675747 U  *  7/2014
CN          108351447 A  *  7/2018
                    (Continued)

OTHER PUBLICATIONS

English Machine Translation of CN 108351447 A (Year: 2018).*
(Continued)

*Primary Examiner* — Charles S Bushey
(74) *Attorney, Agent, or Firm* — Alston & Bird LLP

(57)          ABSTRACT

An atmospheric water generation system absorbs water from an atmospheric air stream into a desiccant flowing along a flow path of a closed desiccant circulation loop. To ensure that the desiccant remains within the closed desiccant circulation loop, the atmospheric water generation system encompasses a membrane-based water extraction device that the desiccant flows through. The desiccant flows through the membrane-based water extraction device on a first side of a membrane, and the membrane separates the desiccant from a water-collection flow. Water absorbed into the desiccant passes from the desiccant, through the porous membrane, and into the water-collection flow, at least in part due to differences in temperature and/or pressure characteristics of the water flow and the desiccant flow. Water collected within the water-collection flow is directed to a storage tank for usage.

20 Claims, 19 Drawing Sheets

(51) Int. Cl.

| | |
|---|---|
| *B01D 53/18* | (2006.01) |
| *B01D 61/36* | (2006.01) |
| *E03B 3/28* | (2006.01) |
| *H01L 25/16* | (2023.01) |
| *H01M 10/46* | (2006.01) |
| *H02S 20/10* | (2014.01) |
| *H02S 30/00* | (2014.01) |
| *H02S 40/00* | (2014.01) |

(52) U.S. Cl.
CPC .............. *B01D 61/364* (2013.01); *E03B 3/28* (2013.01); *H01L 25/162* (2013.01); *H01L 25/167* (2013.01); *H01M 10/465* (2013.01); *H02S 20/10* (2014.12); *H02S 30/00* (2013.01); *H01M 2220/10* (2013.01); *H02S 40/00* (2013.01)

(58) Field of Classification Search
CPC .............. H01L 25/167; H01M 10/465; H01M 2220/10; H02S 20/10; H02S 30/00; H02S 40/00

See application file for complete search history.

(56) References Cited

U.S. PATENT DOCUMENTS

| | | | | |
|---|---|---|---|---|
| 4,783,150 | A * | 11/1988 | Tabony | G02F 1/137 516/29 |
| 5,197,242 | A * | 3/1993 | Baughman | B32B 17/10174 428/34 |
| 5,686,979 | A * | 11/1997 | Weber | G02F 1/133536 359/493.01 |
| 6,391,400 | B1 * | 5/2002 | Russell | B32B 17/10036 359/359 |
| 6,504,588 | B1 * | 1/2003 | Kaneko | G02F 1/133634 349/71 |
| 6,583,827 | B2 * | 6/2003 | Faris | B82Y 15/00 349/114 |
| 7,300,167 | B2 * | 11/2007 | Fernando | B32B 17/10339 359/488.01 |
| 7,411,637 | B2 * | 8/2008 | Weiss | G02F 1/1313 349/16 |
| 7,748,137 | B2 * | 7/2010 | Wang | A01G 9/243 34/396 |
| 7,755,829 | B2 * | 7/2010 | Powers | G02F 1/0147 359/227 |
| 7,942,011 | B2 * | 5/2011 | Forkosh | B01D 53/261 62/271 |
| 8,102,478 | B2 * | 1/2012 | Xue | G02F 1/133536 349/98 |
| 8,519,012 | B2 | 8/2013 | O'Connor | |
| 8,687,258 | B2 * | 4/2014 | Lam | B32B 17/10486 359/241 |
| 8,699,114 | B2 * | 4/2014 | McCarthy | E06B 9/24 359/265 |
| 8,754,269 | B2 | 6/2014 | O'Connor | |
| 9,101,093 | B2 | 8/2015 | Chance et al. | |
| 9,550,142 | B2 | 1/2017 | Roestenberg et al. | |
| 9,751,039 | B2 | 9/2017 | Gebald et al. | |
| 9,969,665 | B2 | 5/2018 | O'Connor et al. | |
| 10,139,695 | B2 * | 11/2018 | Lam | G02C 7/102 |
| 10,232,305 | B2 | 3/2019 | Gebald et al. | |
| 10,260,761 | B2 * | 4/2019 | Martin | F28C 1/14 |
| 10,279,306 | B2 | 5/2019 | Gebald et al. | |
| 10,350,547 | B2 | 7/2019 | Bijl et al. | |
| 10,427,086 | B2 | 10/2019 | Gebald et al. | |

| | | | | |
|---|---|---|---|---|
| 10,583,389 | B2 | 3/2020 | Stuckenberg | |
| 10,807,042 | B2 | 10/2020 | Bijl et al. | |
| 10,882,743 | B2 | 1/2021 | O'Connor | |
| 11,000,799 | B2 | 5/2021 | Stuckenberg | |
| 11,007,470 | B2 | 5/2021 | Wurzbacher et al. | |
| 11,285,425 | B2 | 3/2022 | Sauerbeck et al. | |
| 11,420,149 | B2 | 8/2022 | Gebald et al. | |
| 11,441,393 | B2 | 9/2022 | Meehan et al. | |
| 11,572,765 | B2 | 2/2023 | Meehan et al. | |
| 11,612,879 | B2 | 3/2023 | Gebald et al. | |
| 11,623,177 | B2 * | 4/2023 | Stuckenberg | B01F 23/214 261/75 |
| 11,712,652 | B2 | 8/2023 | Spiteri et al. | |
| 2005/0057701 | A1 | 3/2005 | Weiss | |
| 2005/0185125 | A1 * | 8/2005 | Miyachi | G02F 1/1393 349/128 |
| 2009/0283464 | A1 | 11/2009 | Oe et al. | |
| 2010/0154887 | A1 * | 6/2010 | Bullen | H10F 77/484 136/259 |
| 2010/0236602 | A1 * | 9/2010 | Cohen | F24S 23/74 136/246 |
| 2013/0250392 | A1 | 9/2013 | Lam et al. | |
| 2014/0165460 | A1 | 6/2014 | Blom et al. | |
| 2018/0169571 | A1 | 6/2018 | Stuckenberg | |
| 2018/0307077 | A1 | 10/2018 | Miura et al. | |
| 2019/0060820 | A1 | 2/2019 | O'Connor | |
| 2019/0267933 | A1 * | 8/2019 | Janowski | H02S 20/26 |
| 2021/0162338 | A1 | 6/2021 | Zaworotko et al. | |
| 2021/0205783 | A1 | 7/2021 | O'Connor | |
| 2022/0176310 | A1 | 6/2022 | Suter et al. | |
| 2022/0193598 | A1 | 6/2022 | Suter et al. | |
| 2022/0195706 | A1 | 6/2022 | Stuckenberg et al. | |
| 2022/0288505 | A1 * | 9/2022 | Stuckenberg | B01D 5/0057 |
| 2023/0160283 | A1 | 5/2023 | Meehan et al. | |
| 2023/0173427 | A1 | 6/2023 | Repond et al. | |
| 2023/0201759 | A1 | 6/2023 | Spiteri et al. | |
| 2023/0211276 | A1 | 7/2023 | Spiteri et al. | |
| 2023/0233985 | A1 | 7/2023 | Vargas et al. | |

FOREIGN PATENT DOCUMENTS

| | | | | |
|---|---|---|---|---|
| FR | | 2996576 | A1 | 4/2014 |
| JP | | 62-220119 | A | 9/1987 |
| JP | | 02-208630 | A | 8/1990 |
| JP | | 08-240796 | A | 9/1996 |
| JP | | 10-071320 | A | 3/1998 |
| JP | | 2008-086989 | A | 4/2008 |
| JP | | 2017-187810 | A | 10/2017 |
| TW | | 200906293 | A | 2/2009 |
| WO | WO 2012/162545 | A2 * | 11/2012 |
| WO | | 2017/126683 | A1 | 7/2017 |
| WO | | 2019/198748 | A1 | 5/2020 |
| WO | | 2020/235282 | A1 | 11/2020 |

OTHER PUBLICATIONS

International Searching Authority, International Search Report and Written Opinion received for International Application No. PCT/US2022/036359, Oct. 10, 2022, 14 pages, European Patent Office, NL.

English Translation of JP Office Action, including Search Report dated Feb. 27, 2025 for JP Application No. 2024500268, 24 page(s).

JP Office Action, including Search Report Mailed on Feb. 27, 2025 for JP Application No. 2024500268, 24 page (s).

English Translation of JP Office Action dated Oct. 2, 2025 for JP Application No. 2024500268, 7 page(s).

JP Office Action Mailed on Oct. 2, 2025 for JP Application No. 2024500268, 7 page(s).

\* cited by examiner

ATMOSPHERIC WATER GENERATION SYSTEMS AND METHODS UTILIZING MEMBRANE-BASED WATER EXTRACTION

CROSS-REFERENCE TO RELATED APPLICATIONS

This patent application claims priority to U.S. Provisional Patent Application Ser. No. 63/203,063, filed Jul. 7, 2021, which is incorporated herein by reference in its entirety.

This patent application additionally relates to U.S. patent application Ser. No. 17/552,173, filed Dec. 15, 2021, now U.S. Pat. No. 12,276,090, which claims priority from Provisional Appl. Ser. No. 63/126,860, filed Dec. 17, 2020; this patent application additionally relates to U.S. patent application Ser. No. 16/782,808, filed Feb. 5, 2020, now U.S. Pat. No. 11,000,799, which is a continuation of U.S. patent application Ser. No. 15/850,870, filed Dec. 21, 2017 now U.S. Pat. No. 10,583,389, which claims priority from Provisional Application Ser. No. 62/437,471, filed Dec. 21, 2016; Provisional Application Ser. No. 62/459,462, filed Feb. 15, 2017; and Provisional Application Ser. No. 62/459,478, filed Feb. 15, 2017, all of which are incorporated herein by reference in their entirety

BACKGROUND

The amount of freshwater available for human consumption, plant irrigation, livestock and herd sustenance, commercial and/or industrial usage, and other purposes has generally been overtaken by the amount of freshwater needed for such purposes. Particularly in arid climates characterized by minimal annual rainfall and without access to other freshwater sources, maintaining an adequate amount of water for human and/or animal consumption and usage has become increasingly expensive in recent years. Processes such as desalination, water filtration and/or purification, groundwater (e.g., aquifer) exploitation, and other processes are often used in combination to supply freshwater to various geographical regions, depending on the relative availability and expense of each water sourcing process.

Water shortages in certain geographical regions are also at least partially responsible for food shortages in certain areas of the globe as well. Where water is not readily available for crop irrigation and for hydrating livestock, basic nutritional foods may be difficult to cultivate, and may be difficult or expensive to procure in an open market.

Accordingly, a need generally exists for processes that expand the availability of freshwater, particularly in arid geographical areas and/or areas with no access to standing water or sub-surface water or in areas where such have become contaminated.

Moreover, the ability to control the amount of solar radiation entering a greenhouse (and other attributes of a plant growth habitat), using screens, supplementary lighting, heating, and cooling provide are sought. Such configurations enable the plant growth habitat to be customized to ideal growing conditions for plants grown therein. Combining the ability to customize the plant growth environment within a greenhouse with the ability to generate water for use in the greenhouse could revolutionize greenhouse plant growth technologies. This could significantly improve crop production and profitability, enhancing their nutritional value and appearance.

BRIEF SUMMARY

Various embodiments are directed to an atmospheric water generation system comprising: an absorber configured to intersect an atmospheric air stream with a desiccant flowing along a closed desiccant circulation loop to extract water vapor from the atmospheric air stream and to absorb the extracted water vapor into the desiccant; at least one membrane-based water extraction device configured to extract water from the desiccant for collection within a permeate water flow path, wherein the membrane-based water extraction device comprises: a housing supporting a porous membrane separating a desiccant flow path from the permeate water flow path, wherein the porous membrane permits water vapor to pass through the porous membrane from the desiccant flow path to the permeate water flow path; and at least one heating mechanism to raise the temperature of the desiccant prior to entering the at least one membrane-based water extraction device.

In certain embodiments, the housing of the membrane-based water extraction device comprises an inner flow path and an outer flow path, wherein the inner flow path is located inside of the outer flow path and the inner flow path is separated from the outer flow path by an inner tubular wall, and at least a portion of the inner tubular wall consists of the porous membrane; and wherein one of the desiccant flow path or the permeate water flow path flows in the inner flow path, and the other of the desiccant flow path or the permeate water flow path flows in the outer flow path.

In various embodiments, a fluid flow direction of the inner flow path is opposite to a fluid flow direction of the outer flow path through the housing. In certain embodiments, the at least one membrane-based water extraction device comprises a plurality of membrane-based water extraction devices arranged in series, such that desiccant exiting a first membrane-based water extraction device enters a second membrane-based water extraction device. Moreover, in certain embodiments, the at least one membrane-based water extraction device comprises a plurality of membrane-based water extraction devices arranged in parallel, such that desiccant flowing from the absorber is split into a plurality of parallel flow paths each flowing into a respective membrane-based water extraction device. In various embodiments, the at least one heating mechanism is embodied as a geothermal heating mechanism. According to certain embodiments, the at least one heating mechanism is a heat exchanger wherein a portion of the desiccant flow path upstream of the at least one membrane-based water extraction device flows on a first side of the heat exchanger and a portion of the desiccant flow path downstream of the at least one membrane-based water extraction devices flows on an opposite second side of the heat exchanger. In various embodiments, the atmospheric water generation system further comprises at least one cooling mechanism configured to cool liquid water before the liquid water flows into the at least one membrane-based water extraction device. Moreover, the atmospheric water generation system may further comprise one or more valves positioned along the desiccant flow path, and wherein the one or more valves are configurable between an open configuration in which desiccant flows between the absorber and the membrane-based water extraction device and a closed configuration in which desiccant is isolated from the absorber so as to flow within a closed loop through the membrane-based water extraction device.

Certain embodiments are directed to a method of extracting water from atmospheric air, the method comprising: intersecting an atmospheric air stream with a desiccant in an absorber to extract water vapor from the atmospheric air stream and to absorb the extracted water vapor into the desiccant, wherein the desiccant flows along a closed desiccant circulation loop; heating the desiccant after absorbing water vapor; and passing the desiccant along a first side of a porous membrane within a membrane-based water extraction device to extract water from the desiccant for collection within a permeate water flow path flowing on an opposite second side of the porous membrane, wherein the porous membrane permits water vapor to pass through the porous membrane from the desiccant to the permeate water flow path.

In various embodiments, passing the desiccant along a first side of a porous membrane within a membrane-based water extraction device comprises passing the desiccant through a tubular membrane, wherein the tubular membrane is located within an outer flow path, such that the permeate water flow path flows within the outer flow path, external to the tubular membrane. In certain embodiments, the desiccant flows in a first flow direction and the water-collection flows in a second flow direction opposite to the first flow direction. In certain embodiments, the method further comprises passing the desiccant along a first side of a second porous membrane within a second membrane-based water extraction device to extract water from the desiccant for collection within the permeate water flow path flowing on an opposite, second side of the second porous membrane. In certain embodiments, heating the desiccant comprises heating the desiccant via a geothermal heating mechanism. Moreover, the method may further comprise cooling the desiccant exiting the membrane-based water extraction device before flowing the desiccant into the absorber. In certain embodiments, the method further comprises recirculating the desiccant through the absorber before heating the desiccant by configuring valves between a closed configuration and an open configuration.

BRIEF DESCRIPTION OF THE SEVERAL VIEWS OF THE DRAWINGS

Reference will now be made to the accompanying drawings, which are not necessarily drawn to scale, and wherein.

DETAILED DESCRIPTION

Figure 1A:
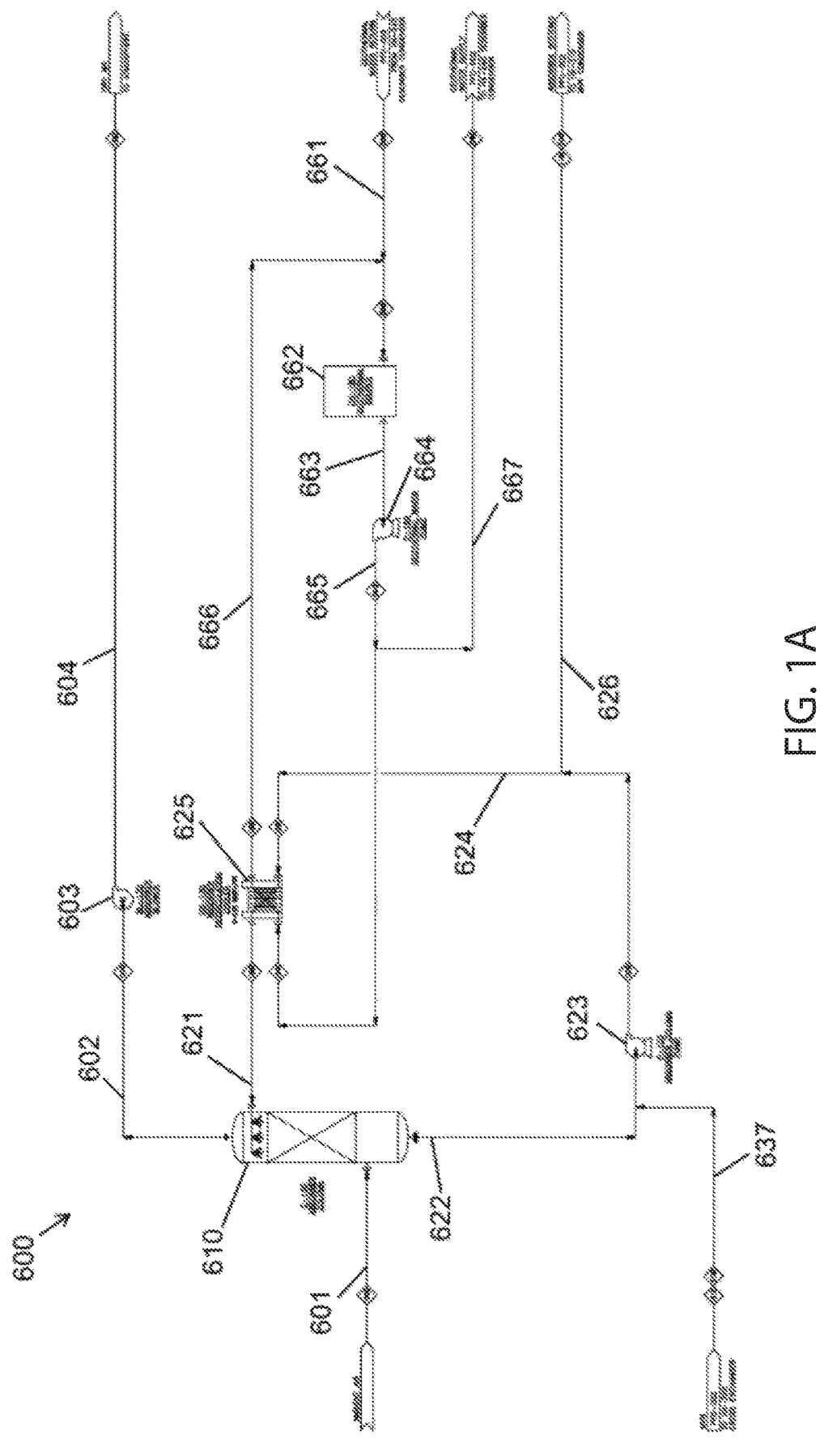
FIGS. 1A-1B show a schematic of an example atmospheric water generation system according to one embodiment.

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Overview

The atmospheric water generation (AWG) system utilizes an absorption system for extracting water from atmospheric air. Even for low-humidity atmospheric air (air having a humidity of greater than zero), certain amounts of water can be extracted from the air, at least in part by contacting the atmospheric air with a rich desiccant solution under controlled conditions conductive to mass transfer of water from the atmospheric air (where it exists in vapor form) into a dilutant of the desiccant solution (where it exists in liquid form).

Various embodiments utilize a membrane-separation module to separate the water from the desiccant solution. The membrane separation module defines two flow paths separated by a permeable membrane. The desiccant solution (a diluted desiccant solution after absorbing water from atmospheric air) flows on a first side of the permeable membrane and permeate water (e.g., in liquid form and/or in vapor form) flows on a second side of the permeable membrane. Water (e.g., water vapor) can penetrate the permeable membrane from the first side to the second side of the permeable membrane. The desiccant solution remains on the first side of the membrane and water remains on the second side of the membrane. The membrane-separation module may additionally enable control of the environmental conditions within the membrane-separation module to encourage mass flow of water across the permeable membrane from the desiccant solution on the first side of the membrane and into the flow of water (liquid water and/or water vapor) on the second side of the membrane. For example, the temperature and pressure may be increased on the first side of the membrane (e.g., by increasing the temperature and/or pressure of the desiccant solution flowing into the membrane separation module), and the temperature and pressure may be decreased on the second side of the membrane (e.g., by decreasing the temperature and/or pressure of the water flow on the second side of the membrane). Certain embodiments may comprise multiple membrane separation modules operating in series or in parallel and/or may comprise additional systems for extracting water from the desiccant solution.

In certain embodiments, the AWG system may be integrated with one or more carbon dioxide filtration/capture modules, one or more greenhouse modules, one or more power generation modules, and/or the like. For example, the source air intake into the AWG system may be routed through a carbon dioxide capture system (after extracting water vapor out of the atmospheric air) prior to exhausting the dry, dehumidified air to the surrounding environment. The captured carbon dioxide may be stored for later processing in a tank, or it may be released (e.g., in a monitored quantity) into one or more greenhouse modules to increase the carbon dioxide concentration within the greenhouse to thereby increase crop growth efficiency.

Moreover, a power generation module, which may comprise one or more renewable energy power generation systems, such as solar/photovoltaic, geothermal, and/or the like, or hydrocarbon-fuel based power generation systems, may be integrated with the AWG system to provide needed electrical and/or thermal energy inputs for the AWG processes. In the event that such power generation modules generate carbon dioxide or other exhaust gases, the exhaust gases of the power generation modules may be routed through the carbon dioxide capture modules to decrease the carbon dioxide production of the integrated system.

In certain embodiments, the AWG system may be integrated with one or more variable solar canopies. The variable solar canopy may be integrated into a greenhouse module (such that the solar canopy defines an exterior surface of the greenhouse). The variable solar canopy is configured to enable variable amounts of solar radiation through the solar canopy and into the interior of the greenhouse, thereby providing control of the growth environment (including the amount of light received) within the greenhouse environment. The variable solar canopy may provide location-specific adjustability of opacity of the solar canopy so as to enable location-specific customization of the amount of light passing through the solar canopy. The level of opacity of solar canopy may be adjusted by applying an external signal, such as an electric signal, to solar canopy using one or more controllers.

Atmospheric Water Resources

The atmosphere contains approximately 3100 cubic miles ($mi^3$) or 12,900 cubic kilometers ($km^3$) of water. This quantity is roughly equivalent to all of the water held by the Great Lakes by volume. Water vapor as a natural resource is constantly replenished by the natural closed loop hydrologic cycle, thereby providing a nearly limitless supply of water that may be extracted from air without adverse environmental impact.

Atmospheric Water Generation

The process of AWG comprises systems and methods for extracting water vapor from atmospheric source air at least in part by condensing the water vapor and capturing the condensed, liquid water (e.g., by absorbing the liquid water into a desiccant solution). Certain embodiments may be combined with carbon dioxide capture systems as discussed herein. Certain embodiments comprise steps for preconditioning and/or compressing raw source air (e.g., air at atmospheric conditions) to ease the water extraction process, and/or condensing the water vapor trapped within the raw source air (e.g., by increasing the humidity of at least a portion of the raw source air) to maximize the amount of water vapor that may be extracted from a given unit volume of source air. As discussed herein, processed source air is compressed, consolidated, and/or otherwise manipulated through one or more processes, for example, to ease the water extraction process.

Ultimately, various embodiments of the AWG process comprise condensation mechanisms through which source air (raw source air and/or processed source air, as discussed herein) may be directed over one or more condensation surfaces each having a surface temperature below the dew point of the source air. As the source air flows over and/or around the condensation surfaces, the temperature of the source air adjacent the condensation surfaces drops (e.g., through convective heat transfer), and water vapor within the source air condenses on the condensation surfaces, and the condensed, liquid water flows into a storage vessel (e.g., a capture tank) and/or to one or more related modules (e.g., a greenhouse module) for immediate use.

Air Preconditioning

As noted above, raw source air may be preconditioned to ease the water extraction process utilized to ultimately condense water vapor into usable liquid water. In certain embodiments, the preconditioning process may comprise steps for compressing the air to increase the vapor pressure of the air (thereby biasing a greater volume of water to the liquid state rather than the vapor state) and/or to decrease the temperature of the source air to a temperature nearer to the dew point. In certain embodiments, an air preconditioning system described herein may be utilized before and/or after a humidity increasing system, such as a desiccant-based humidity increasing system as described herein. Moreover, the air preconditioning system may be utilized before and/or after a carbon dioxide capture system as discussed herein.

As just one example, the air preconditioning process may comprise a series of compressors/pumps, venturi valves, vortex valves, manifolds, and/or the like collectively configured to decrease the temperature of the source air closer to the air dew point and/or to increase the pressure of the air prior to removing water vapor from the air (e.g., through condensation or absorption by a desiccant). For example, raw source air may be drawn into the air preconditioning system via a vacuum pressure formed at an inlet via a compressor 101 (e.g., a turbine/blower compressor having a plurality of stator or variable pitch turbine blades controllable via servo motors) and/or a centrifugal fan configured to increase the raw air pressure entering the air preconditioning system. In certain embodiments, the compressor and/or centrifugal fan may be rotated via one or more electrical motors (which may receive electrical input power from one or more power systems in communication with the air preconditioning system) mechanically connected with the compressor and/or centrifugal fan via a gear transmission, a belt drive, a chain drive, and/or the like.

In embodiments comprising a centrifugal fan, particulates, dust, and other heavy air contaminants are spun to the outermost edge of the centrifugal fan and are removed from the air stream and ejected from the air preconditioning system.

In certain embodiments, the filtered air may be directed into a carbon dioxide capture column, where it is passed over a fixed absorption bed configured to absorb carbon dioxide from the air, as discussed in greater detail herein. The carbon dioxide may be separated and directed away from the air stream via a compressor.

In certain embodiments, the filtered air (with a reduced carbon dioxide content) may be directed further through the air preconditioning system into a primary manifold, where the air is divided at a selected ratio by a variable plenum/valve. From the primary manifold, a first air stream continues along a bulk air stream, and a second air stream is directed to a vortex tube manifold as discussed herein.

The bulk air stream may proceed through one or more venturi valves each configured to decrease the pressure and temperature of the bulk air stream (the volume and quantity of air remains constant across each venturi valve while the pressure decreases, thereby causing the temperature of the air stream to decrease proportionally to the temperature) and/or through a precooler (e.g., a heat exchanger with a cooling fluid passing therethrough). After proceeding through the one or more venturi valves and/or the precooler, the bulk air stream may proceed to a temperature measurement portion, where the temperatures (e.g., dry bulb and wet bulb temperatures) of the bulk air stream are measured by one or more temperature measurement devices (e.g., thermometers) to determine the dew point of the bulk air stream. Outputs from the temperature measurement devices may be utilized by a controller to mix the bulk air stream with at least a portion of the vortex-chilled air stream to lower the temperature of the bulk air closer to the air dew point. For example, the controller may be in electronic communication with an electromechanical mixing valve that may be selectably opened or closed to vary the amount of vortex-chilled air that is introduced into the bulk air stream. Based on the determined dry-bulb and/or wet-bulb temperatures (as monitored by the controller), the controller may transmit a signal to a motor to move the electromechanical valve to a desired position to obtain a desired mixture of vortex-chilled air with the bulk air stream.

The vortex-chilled air begins as the second stream of air exiting the primary manifold. The second stream of air exits the primary manifold, and proceeds to a vortex tube manifold where it is pressurized (e.g., via a compressor) to a sufficient pressure to achieve a drop in temperature of the air travelling through one or more vortex tubes 106 of between approximately 70-150 degrees Fahrenheit. For example, the air may be pressurized to at least approximately 70-120 PSI prior to being directed into the one or more vortex tubes. Each vortex tube comprises an entry port directing the stream of air tangentially into an internal spin chamber. As air enters the spin chamber, the air takes on an angular momentum, causing dense, warm air to migrate towards an exterior perimeter of the spin chamber and out of an exhaust valve. In certain embodiments, the warm air may be utilized to heat a carbon dioxide capture column. The remaining, vortex-chilled air migrates toward the center of the spin chamber and out of a vortex outlet. As mentioned above, the vortex-chilled air may be mixed with the bulk air stream to lower the temperature of the bulk air stream closer to the dew point. As yet another alternative, the vortex chilled air may be utilized to chill the precooler through which the bulk air passes.

In certain embodiments, the mixed and chilled bulk air stream is then directed into a condensation chamber, where the water vapor within the air is condensed into liquid water. As just one example, the bulk air stream may be directed over a series of condensation surfaces (e.g., chilled plates, screens, tubes, and/or the like configured to lower the localized temperature of the air at the condensation surfaces below the air dew point, thereby causing the water vapor to condense on the condensation surfaces. The condensed water may then be routed from the condensation surfaces into a retention chamber for collection and later use. However, it should be understood that any of a variety of condensation mechanisms may be used. For example, as discussed herein, one or more desiccant-based condensation mechanisms may be utilized to more effectively remove water vapor from the bulk air stream. Moreover, in certain embodiments the air-preconditioning system may be omitted, and raw air may be filtered and/or directed immediately into a condensation chamber. Such embodiments may have a lower input power requirement, and therefore the amount of power required for water generation may be decreased.

It should also be understood that certain preconditioning system embodiments comprise one or more filters (e.g., fabric-based air filters, non-woven based air filters, and/or the like), one or more refrigerant systems (e.g., warm air is passed through a heat-exchanger to lower the temperature of the air closer to the dew point), and/or the like in place of or in addition to the vortex and venturi valve mechanisms discussed herein.

Desiccant-Usage within an Atmospheric Water Generation System

As mentioned above, certain embodiments comprise one or more subsystems configured to increase the humidity of a portion of the source air to increase the amount of water that may be extracted from the source air. Specifically, water vapor may be extracted from a first, large quantity of source air, and may be reintroduced into a second, smaller quantity of source air, thereby consolidating the water vapor of the source air and increasing the humidity of the second quantity of source air before the water vapor in the second quantity of source air is condensed into liquid water.

AWG systems as discussed herein comprise at least one air scrubber comprising a column for contacting atmospheric air (e.g., after increasing the humidity of the air) with a desiccant. In certain embodiments, the desiccant solution may be a fluid, a gel, and/or the like within the typical operating temperature ranges discussed herein. The desiccant may be selected from any of a variety of ionic solutions capable of absorbing water, such as lithium-chloride (LiCl), lithium-bromide (LiBr), Calcium Chloride (CaCl), triethylene glycol, and/or the like. Other, unlisted chemical compounds having hygroscopic characteristics may be provided for use as the desiccant solution in certain embodiments. The hygroscopic fluid may also be comprised of surfactants and/or nanofluids. In certain embodiments, the desiccant solution may comprise a mixture of a plurality of ionic solutions, such as a mixture of LiCl solution and CaCl solution, The desiccant may be dissolved in water to provide a highly concentrated desiccant solution that may be pumped (e.g., via liquid pumps) through the at least one desiccant column. Other materials, including gels, aerogels, desiccant granules flowable subject to granular flow principles, and/or the like may be utilized in place of desiccant solutions in certain embodiments.

Moreover, the amount of water vapor that may be absorbed by the desiccant (and/or released by the desiccant) is dependent on the vapor pressure and temperature of a closed system including the desiccant. Accordingly, various embodiments are configured to absorb water from the air into the desiccant while the vapor pressure in the closed system is high and the temperature is low, and those same embodiments are configured to extract water from the desiccant while the vapor pressure is low and the temperature is high.

Water Absorption from Atmospheric Air

Water may extracted from air via one or more absorption modules. AWG systems (an example of which is shown as system 600 shown in FIGS. 1A-1B) may incorporate a single absorption module or multiple absorption modules. The absorption modules are connected with additional modules within the AWG system, including the water extraction module(s) discussed in greater detail below, such that the desiccant can flow between the water absorption module and the additional modules of the AWG system. Flow paths to and from the absorption modules within the overall AWG system may be configurable (e.g., configurable via valves between open and closed configurations), such that the absorption modules can operate as closed-modules in a batch-operating mode (with the desiccant flowing only within the absorption module and/or between multiple absorption modules) prior to passing the desiccant to water extraction modules. In other embodiments (e.g., when valves are in an open configuration, or in embodiments without valves), the desiccant flows freely between the absorption module(s) and the water extraction module(s), such as in a continuous flow operating configuration.

Moreover, as mentioned, air entering the absorption module(s) (e.g., via air flow path 601 entering absorber 610 and exiting absorber as dry air via flow path 602-604 shown in FIG. 1A) may flow from a pre-conditioning module configured for increasing the humidity of atmospheric air prior to extracting water from the atmospheric air within the absorber 610. In other embodiments, air may flow directly into the absorption module(s) from the surrounding atmosphere external to the AWG system.

The absorption module according to certain embodiments comprises an absorber 610 configured to contact ambient/atmospheric air (e.g., after preconditioning) with a desiccant (flowing through the absorber 610 along flow paths 621-622) so as to absorb water from the atmospheric air into the desiccant. The absorber 610 may be embodied as a vessel in which the desiccant flows between an inlet (via flow path 621) and an outlet (via flow path 622), and the ambient/atmospheric air flows between an air inlet (flow path 601) and an air outlet (flow path 602-604, inclusive of blower 603). Within the vessel, the ambient air contacts the desiccant to enable mass transfer of water vapor from the ambient air into the desiccant. In certain embodiments, one or more baffles, flow interrupters, packings (e.g., structured packing or random packing) may be placed within the absorber so as to increase the surface area of the desiccant and/or to increase the contact time between the ambient air and the desiccant.

In certain embodiments the absorber 610 is configured in a counter flow configuration where atmospheric air enters the absorber 610 proximate to the bottom of the absorber 610. Dry, atmospheric air then exits the absorber 610 proximate the top of the absorber 610 via a specific flow path (with a pump/blower 603 utilized to move air through the absorber 610). Rich desiccant (e.g., a desiccant fluid) enters proximate the top of the absorber 610 via an inlet flow path 621 and flows down through the interior of the absorber 610 due to gravity. Water is absorbed from the ambient air into the desiccant, such that dilute desiccant exits the absorber proximate to the bottom of the absorber 610 along an outlet flow path 622. In certain embodiments, flow modifiers, such as barriers, mesh, packing components, and/or turns in exit piping from the absorber 610 may be used to reduce carry over of desiccant in the air exit of the absorber 610. In certain embodiments the flow modifiers may be positioned in the interior of the absorber 610 proximate to the top of the absorber 610 (e.g., at a mouth of an exhaust port for dry ambient air to exit the absorber via an exhaust air flow path).

In certain embodiments, the absorber 610 operates in a cross-flow configuration where air enters the absorber from one the side of the absorber 610 and traverses (e.g., at least substantially horizontally) to the other side. Rich desiccant (e.g., desiccant fluid) enters the top of the absorber 610, absorbs water from the ambient air as it flows to a low point in the absorber 610 where dilute desiccant exits proximate the bottom. In this fashion, the air flow is at least substantially perpendicular to the flow of desiccant within the absorber 610. In this configuration, the air inlet and air outlet are approximately at the same height on the absorber 610.

In certain configurations, the absorber 610 is operated in the cross-counter flow configuration where air enters the absorber 610 from one the side of the absorber 610 and traverses to the other side. Rich desiccant (e.g., desiccant fluid) enters proximate the top of the absorber 610 and absorbs water from the ambient air as it flows to a low point in the absorber 610 where dilute desiccant exits proximate the bottom of the absorber 610. In this configuration, the air inlet and air outlet are offset in level from each other. In this configuration, the air inlet can be at the side of the absorber 610 at a location proximate to the top of the absorber 610 and the air outlet is on the side of the absorber 610 proximate to the bottom. In another orientation of this configuration, the air inlet is positioned on the side of the absorber 610 proximate to the bottom of the absorber 610 and the air outlet is positioned on the opposite side of the absorber 610 proximate to the top of the absorber 610. The air travels along a path extending at an angle through the absorber 610 from the top of the absorber 610 to the bottom or the bottom of the absorber 610 to the top.

Figure 3A:
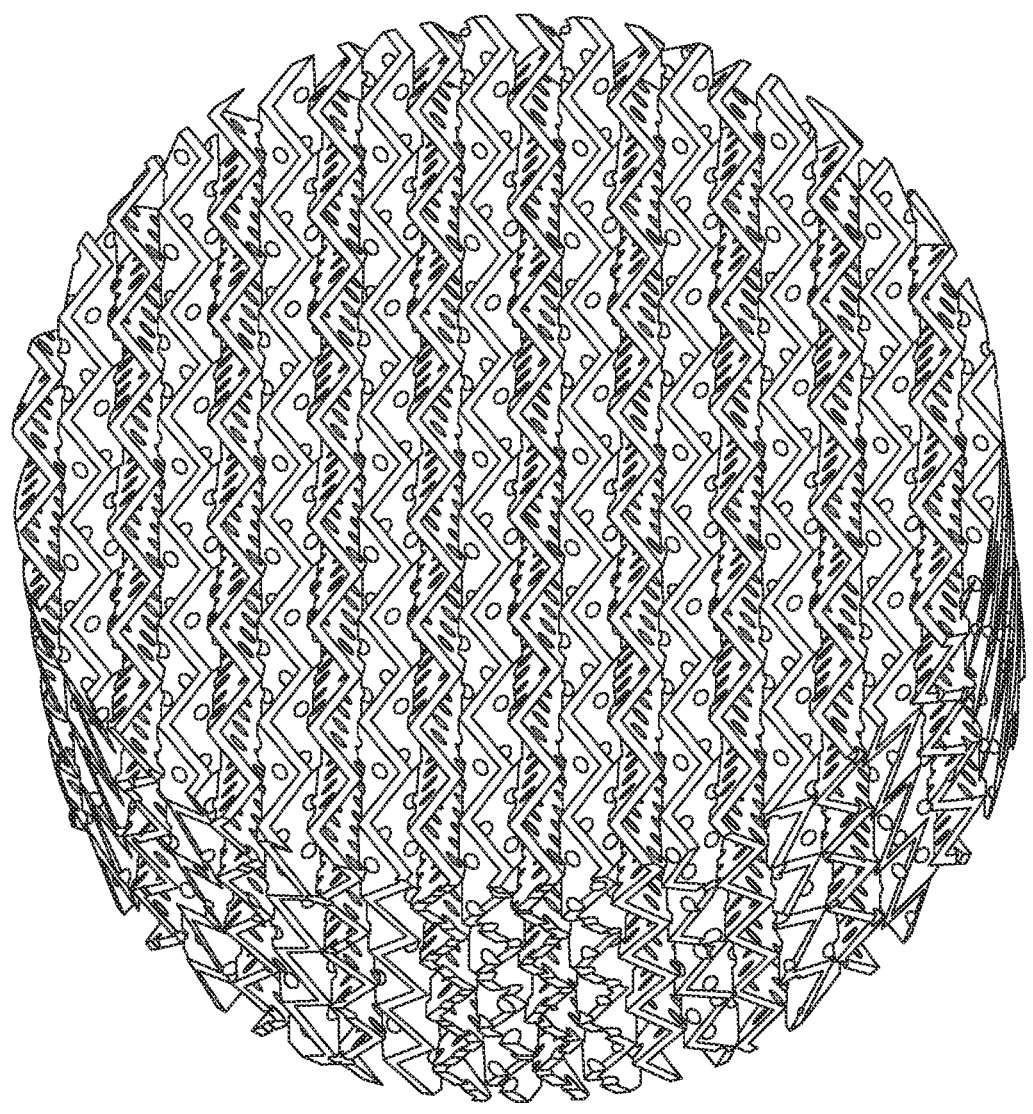
FIGS. 3A-3B illustrate example packing components within an absorber according to certain embodiments.
Figure 3B:

In certain embodiments, the interior of the absorber 610 comprises a plurality of packing components around which the rich desiccant flows as it absorbs water extracted from the humid ambient air. The packing components are provided to increase the surface area of the rich desiccant flowing within the absorber 610 and also to provide a highly tortuous flow path for ambient air flowing through the absorber 610 such that the air has a turbulent flow through the interior of the absorber 610. The absorber 610 may be embodied as a counter flow vessel described above, with the rich desiccant (e.g., desiccant fluid) entering the absorber 610 at a desiccant vessel inlet located at or near the top of the absorber 610, and the ambient air inlet is located at the bottom of the absorber 610. The ambient air flows upwards to a dry air exhaust located at or near the top of the absorber 610, and the desiccant fluid flows downward, across the packing components, to a dilute desiccant outlet of the absorber 610. As examples, the packing components may comprise individual blocks, balls, trays, baffles and/or any other shape defining a plurality of baffles, slits, holes, meshes, and/or other flow modifying components that may be positioned within the absorber 610 to collectively define a highly tortuous path for the ambient air and the desiccant fluid to pass through the absorber 610. The packing components may comprise (be formed of) a material that is not reactive to the desiccant fluid. Example packing components are illustrated in FIGS. 3A-3B. In certain embodiments, a plurality of packing components (such as the unstructured packing component shown in FIG. 3B) may be positioned within the absorber 610 without physically connecting the packing components relative to one another. In other embodiments, a single packing component (such as the structured packing example of FIG. 3A) sized and shaped specifically for the interior of the absorber 610 may be provided and positioned within the absorber 610.

The packing components of certain embodiments may be placed in a structured configuration to define channels set at different angles to each other with or without holes that collectively define structured flow paths for the ambient air and the desiccant fluid flowing through the absorber 610. To provide a structured packing configuration, the packing components are placed in the absorber 610 in an ordered stacked manner. Packing components can also be positioned randomly in which a plurality of geometrically shaped components are randomly placed in the absorber 610 to increase surface area. Although discussed as a packing-based absorber, it should be understood that the desiccant fluid can be passed through the absorber 610 via other configurations, such as by atomization of a liquid desiccant fluid, by spraying the desiccant fluid within the absorber and/or the like).

In use of an overall AWG system, ambient air (at an ambient temperature and an ambient humidity level) is directed into absorber 610 (although not shown, a blower may be implemented at the air intake to the absorber 610 to increase the volumetric flowrate of ambient air entering the absorber 610). In the absorber 610, the ambient air contacts a rich (concentrated) desiccant (e.g., desiccant fluid) provided to the absorber 610 at a low temperature, to increase the vapor pressure within the absorber to encourage water vapor within the humid ambient air to condense and to be absorbed by the desiccant fluid while the humid air contacts the rich desiccant. While the ambient air and the desiccant fluid flow through the absorber 610, humidity within the air condenses and/or is otherwise absorbed into the desiccant fluid to dilute the desiccant fluid and to dry the air. The dry air then exits the absorber back to the atmosphere, as indicated at 602. As shown, a blower 603 may be incorporated at an ambient air exhaust of the absorber 610 to increase the volumetric flowrate of air passing through the absorber 610. The blower 603 may be provided in addition to, or as an alternative to, the above-mentioned blower placed at the ambient air intake of the absorber 610. Moreover, once the desiccant fluid has passed through the absorber 610, a diluted, but still cool, desiccant fluid exits the absorber 610 as indicated at reference 622.

According to certain embodiments, dilute desiccant (e.g., a desiccant fluid) exits the absorber 610 to a pump 623. In certain operation, the absorber module can be operated in a batch configuration where a series of valves may be configured to isolate the absorber module from other portions of the AWG system, and to thereby recirculate the dilute desiccant along a recirculation flow path (while additional rich desiccant fluid is prevented from entering the closed loop via flow path 637 while appropriate valves remain closed) and through a pre-absorber heat exchanger 625 (e.g., a shell-and-tube heat exchanger, a plate heat exchanger, and/or the like) to cool the dilute desiccant (the opposite side of the heat exchanger is cooled water that has been collected from the overall system, as discussed in greater detail herein) before it is passed back into the top of the absorber 610 as indicated at 621. In this way, the amount of water absorbed into the desiccant fluid may be increased (thereby increasing the level of dilution of the desiccant) before the desiccant is directed to evaporation portions of the overall system.

In certain embodiments, the absorption module comprises a pre-absorber heat exchanger 625 that is cooled through the use of a chiller using a cooling media (e.g., water, glycol, and/or the like) that cools the rich desiccant flowing into the pre-absorber heat exchanger via flow path 624 (e.g., the cooling media is separated from the desiccant, such as on opposite sides of a heat exchanger) before the rich desiccant enters the absorber 610.

In certain operation, the absorber module can be operated in a continuous configuration where valves are configured to recirculate a certain amount of dilute desiccant fluid along the recirculation flow path and a certain amount of dilute desiccant fluid flows toward the water extraction module through a separate flow path (flow path 626) connecting the absorption module and the water extraction module. In this configuration, a certain amount of dilute desiccant fluid flows along the recirculation flow path through the pre-absorber heat exchanger 625 (e.g., a shell-and-tube heat exchanger, a plate heat exchanger, and/or the like) to cool the dilute desiccant fluid (the opposite side of the heat exchanger 625 is cooled using water that has been collected from the overall system) before it is passed back into the top of the absorber 610 as indicated at 621. Dilute desiccant fluid simultaneously traverses along a separate flow path 626 to the water extraction module. The cooling fluid passes through flow paths 661-667, which encompasses a recirculation loop of fluid, as well as a cooling system 662 and pump 664 that ensures adequate flow of fluid through the pre-absorber heat exchanger 625. Portions of the fluid return to a fluid store via flow path 667.

In certain embodiments, the absorber 610 is configured such that the rich desiccant is not cooled in a heat exchanger. In this embodiment, cooling of the desiccant fluid may be provided via thermal conductive heat exchange with ambient air through the conductive pipes along certain flow paths leading to an intake of the absorber. Fluid cooling may be provided in the absorber 610 as sensible heat is exchanged with the atmospheric air, provided that the air temperature is lower than the entering desiccant fluid temperature.

As just one example, rich desiccant fluid moving toward the absorber 610 may be directed through a series of geothermal tubes having heat transfer properties with surrounding ground beneath the AWG system. The rich desiccant fluid may directly pass through the series of geothermal tubes, or the rich desiccant fluid may pass through a dual-fluid heat exchanger opposite a cooling fluid that is maintained at a desired low temperature via geothermal cooling. As yet another example, the desiccant may pass through a heat exchanger (e.g., a shell-and-tube heat exchanger) to cool the desiccant fluid. The heat exchanger may be cooled via a cooling solution that passes through a refrigeration circuit and/or other fluid chiller to absorb heat from the desiccant fluid before the desiccant fluid enters the absorber 610.

As yet another example, the single-stage water consolidation system may be positioned proximate a high-pressure gas well, such as proximate a natural gas well, an oil well (where natural gas is extracted simultaneously with oil), and/or the like. The high pressure gas may be directed through one or more expansion valves to regulate and/or decrease the pressure of the incoming gas, which, through the Joules-Thompson effect, experiences a rapid temperature decrease (following the gas law formula, the pressure of the gas rapidly decreases across the valve while the volume and amount of gas remains substantially constant, thereby causing a proportional rapid temperature decrease across the expansion valve). The expanded and super-cooled gas may be passed through a heat exchanger opposite the rich desiccant fluid, thereby absorbing heat from the rich desiccant fluid and decreasing the temperature of the desiccant fluid prior to entry into the absorber 610. The expanded gas may then be directed away from the AWG system, where it may be collected for future use, flared off, utilized for power generation (e.g., via a steam turbine), and/or utilized to heat the desiccant fluid entering the water extraction module, as discussed herein.

In certain embodiments the absorber 610 is configured such that the diluted desiccant fluid exits the absorber 610 and is sent to the water extraction module without a recirculation path. Rich desiccant fluid returning from the water extraction module may or may not be cooled with a heat exchanger and/or chiller and/or geothermal cooling prior to entering the absorber 610. For example, dilute desiccant that exits the absorber 610 is pumped along a flow path extending between the absorption module and the water extraction module when appropriate valves are closed to prevent the dilute desiccant from recirculating into the absorber 610 as discussed above.

In certain embodiments, the absorber 610 may be embodied as a membrane-separated absorber, having a desiccant flow path on a first side of a porous membrane, and an air flow path on an opposite, second side of the porous membrane. Separating the air flow path from the desiccant solution flow path may impede undesirable mass flow of the desiccant salt (e.g., aqueous desiccant salt) itself into the air flow path and ultimately out of the AWG system. Water may be absorbed by the desiccant from the air based on osmotic water flow through the membrane from the air to the desiccant solution. Water vapor may condense on the second side of the membrane, travel through the membrane pores through capillary action, and be absorbed by the high-salt content concentrated desiccant solution. In certain embodiments, the membrane is embodied as a porous membrane, having pores of adequate size (e.g., average pore diameter, maximum pore diameter, and/or the like) to enable water molecules to pass through the membrane while the desiccant salt is prevented from passing through the membrane. As examples, the porous membrane may be a non-woven material, such as polytetrafluoroethylene (PTFE), expanded poly-tetrafluoroethylene (ePTFE), polypropylene (PP), polyvinylidene fluoride (PVDF), and/or the like. Other materials, including nylons and/or other synthetic materials may additionally be used in certain embodiments. In various embodiments, synthetic and/or natural materials may be utilized. The porous membrane may be at least partially woven in certain embodiments. In certain embodiments, the membrane may be organic, inorganic, polymeric, mesoporous, ceramic, and/or the like. In certain embodiments, the membrane may comprise metal organic frameworks, carbon nanotubes and/or a combination thereof. The membrane may be hydrophilic and/or hydrophobic or may be treated (e.g., with a coating) to allow the membrane to be hydrophilic and/or hydrophobic. As example membrane geometries, the membrane may be spiral wound, flat plate and frame style, or tubular. As the desiccant solution and the water flow past opposite sides of the membrane, water molecules migrate from the desiccant solution through the membrane (via capillary action), to the permeate water flow (e.g., water vapor and/or liquid water). In certain embodiments, the membrane may be supported within a frame via spacers, such as a lattice, a grid, and/or the like to provide mechanical support for the membrane to maintain a desired orientation of the membrane within the housing.

Various embodiments of the absorption module comprise a multi-stage absorber configuration, including a plurality of absorbers arranged in series (such that the desiccant flows from a first absorber, through a second absorber, and sequentially through additional absorbers within the multi-stage absorber configuration. Alternatively, the multi-stage absorber configuration encompasses a plurality of absorbers arranged in parallel, such that the desiccant is split to flow through the plurality of absorbers in parallel.

Moreover the plurality of absorbers may be arranged in series within the air flow path, such that source air may be pulled from the environment and passed through the plurality of absorbers in series prior to being exhausted back to the environment as dry air. For example, the source air may be first passed through the low concentration absorber to absorb a first quantity of water from the air, then may be passed through the high concentration absorber to absorb a second quantity of water from the air. Because the initial absorption requires less energy (and does not require a low vapor pressure between the air and the liquid desiccant), the initial absorption using the lower concentration desiccant fluid enables absorption of a first quantity of water from the air. After the initial, low energy requirement absorption process is completed, the air (which still contains water vapor) is passed through the second absorber having a higher concentration desiccant fluid, such that a second quantity of water is absorbed from the air. The now dry (e.g., low humidity) air may then be exhausted from the system to the environment.

On the desiccant side, once the dilute desiccant exits the low concentration absorber, the desiccant fluid passes to a water extraction module as discussed herein to extract water therefrom (and to consequently reconcentrate the desiccant).

In certain embodiments, each absorber may be in fluid communication with a corresponding water extraction module, such that each absorber is associated with a separate and independent desiccant flow path loop. For example, a first quantity of desiccant fluid may flow between a first absorber and a first water extraction module, and a second desiccant fluid may flow between a second absorber and a second water extraction module, and the first quantity of desiccant fluid does not mix with the second quantity of desiccant fluid. In certain embodiments, the first quantity of desiccant fluid may comprise a first desiccant (e.g., LiCl) and the second quantity of desiccant fluid may comprise a second desiccant (e.g., CaCl).

Moreover, in embodiments comprising a plurality of independent desiccant flows, each desiccant flow may have a different concentration range. For example, a first desiccant flow (e.g., corresponding to a first absorber passed through by source air) may have a first concentration range measured between a high concentration value at an exit of the water extraction module and a low concentration value at an exit of the absorber; and a second desiccant flow may have a second concentration range. As the source air is directed through the absorption columns in series, the air may be directed through a low concentration range absorption column first, and may be directed through a high concentration range absorption column second.

Membrane-Based Water Extraction from a Desiccant

The water extraction module is provided to remove water from a diluted desiccant (e.g., from a diluted desiccant fluid) for storage and use as potable or other clean liquid water uses. The water extraction module comprises one or more membrane-based water extraction devices (e.g., connected in series or in parallel) and is connected to the absorption module via various flow paths to enable desiccant (e.g., diluted desiccant and rich desiccant) to flow between the absorption module and the water extraction module. The membrane-based water extraction device (also referred to as a fluid separation device) also acts to concentrate the desiccant solution into a concentrated desiccant retentate solution which may be reprocessed through the atmospheric water generation system.

The water extraction module comprises at least one membrane-based water extraction device 633 defining two flow paths separated by a permeable membrane 633a. On a first side of the permeable membrane 633a, the desiccant flows along a desiccant flow path (between flow path 632 and flow path 634) and on the opposite, second side of the permeable membrane, permeated fluid (e.g., water vapor) is captured then transferred (within portion 633c, located within the water extraction device between flow path 650 and flow path 651). Both the desiccant (on the first side 633b of the permeable membrane 633a) and the captured permeate fluid (on the second side 633c of the permeable membrane 633a) are in contact with opposite sides of the permeable membrane 633a while flowing past the permeable membrane 633a. The membrane 633a may thereby separate the desiccant flow path from the captured permeate (water vapor) flow path, which comprises water vapor collected during the water collection/fluid separation process (e.g., water vapor that migrates through the porous membrane 633a) and condenses into a liquid permeate water flow (e.g., downstream of the membrane-based water extraction device). In certain embodiments, mass transfer of water vapor across the membrane 633a may be driven by raising the vapor pressure of the desiccant. This may be accomplished by heating of the desiccant prior to contact with the membrane 633a (on the desiccant side 633b of the membrane). Lowering the pressure (e.g., by using a vacuum mechanism) to reduce the pressure on the permeate side 633c of the membrane 633a, also causes mass transfer of water vapor across the membrane. As the desiccant flows past the porous membrane 633a (on the first, desiccant side 633b of the membrane), the water in the desiccant begins permeation across the membrane 633a in the vapor state and exits the membrane 633a (on the second side) in the vapor state. The water vapor then condenses as it cools and flows along the water flow path (e.g., at least partially by utilizing a heat exchanger (e.g. condenser 627) and/or contacting it with a colder fluid (e.g. condensed water)).

In certain embodiments, the desiccant side 633b may be heated by a heating fluid (e.g., heating oil, steam, glycol, and/or the like) that is separated from the desiccant flow path within the membrane-based water extraction device via a heat-conductive layer (e.g., a heat-conductive, non-porous film, a metal sheet, and/or the like. In certain embodiments, the desiccant side 633b may be embodied as a shell-and-tube heat exchanger, with the heating fluid flowing through tubes and the desiccant flowing through the shell, with certain wall(s) of the shell being embodied as the porous membrane 633a. In certain embodiments, the heating fluid may be a product of the AWG system, thereby utilizing sensible heat transfer to heat the desiccant fluid to encourage water vapor migration across the membrane. In other embodiments, the heating fluid may be a product (e.g., a final product, a waste product, or an intermediate product) of a spatially proximate process, such as mining, gas extraction, power production, and/or the like.

As discussed in greater detail herein, the permeate side 633c may similarly comprise a heat-exchanger configuration to lower the temperature of the permeate fluid to encourage condensation thereof. For example, a cooling fluid (e.g., liquid water extracted from a liquid water storage tank 655, a refrigerant (e.g., glycol), and/or the like) may be separated from the permeate flow path by a heat-conductive layer (e.g., a heat-conductive, non-porous film, a metal sheet, and/or the like). The cooling fluid cools the heat-conductive layer, thereby providing a surface within the permeate fluid flow on which water vapor can condense. In certain embodiments, the permeate side 633c may be embodied as a shell-and-tube heat exchanger, with the cooling fluid flowing through tubes and the permeate fluid flowing through the shell, with certain wall(s) of the shell being embodied as the porous membrane 633a. In such embodiments, the outer surfaces of the tubes are provided as condensation surfaces for the water vapor. In certain embodiments, the cooling fluid may be a product of the AWG system (e.g., liquid water), thereby utilizing sensible heat transfer to cool the permeate to encourage water vapor migration across the membrane and to encourage condensation of the water vapor.

The membrane 633a may comprise a hydrophobic porous membrane, such as non-woven membrane having a small pore size. As just one example, the membrane may comprise PTFE, ePTFE, PP, PVDF, and/or the like, that is hydrophobic by design. In certain embodiments, the membrane may be organic, inorganic, polymeric, mesoporous, ceramic, and/ or the like. In certain embodiments, the membrane may comprise metal organic frameworks, carbon nanotubes and/ or a combination thereof, such as by stacking layers of material. The membrane may be hydrophilic or hydrophobic or may be treated (e.g., with a coating) to allow the membrane to be hydrophilic and/or hydrophobic. The use of a hydrophobic material (or a material having a hydrophobic coating) encourages water vapor to selectively pass through the membrane to be retained on the permeate water side 633c of the membrane. Adhering a layer of hydrophobic material to the membrane on the desiccant side 633b causes only volatile vapors to pass through and fluids in the liquid state are retained on the desiccant side 633b of the membrane. As examples of membrane geometries, the membrane may be spiral wound, flat plate and frame style, or a hollow tube. As the desiccant solution flows across the desiccant side 633b of the membrane, water molecules migrate from the desiccant solution through the membrane (via capillary action) in the form of vapor, to the permeated water side 633c, leaving a highly concentrated desiccant solution on the desiccant side 633b of the membrane 633a.

The membrane-based water extraction device 633 is embodied as a housing having a desiccant inlet and a desiccant outlet on the desiccant side 633b of the membrane 633a, and a permeate inlet and a permeate outlet on the permeate side 633c of the membrane 633a. In other example embodiments, the membrane-based water extraction device 633 may utilize gravity to remove permeate fluid from the membrane-based water extraction device 633, and in such embodiments, the permeate flow path need not include an inlet (such that gravity alone is sufficient to move the permeate fluid through an outlet of the device). For example, as the desiccant fluid flows from an inlet to an outlet of the membrane-based water extraction device, water vapor migrates through the membrane into vapor form on a permeate side of the membrane. The permeate side of the membrane may be cooled (e.g., using a cooling fluid separated from the permeate side of the membrane by a heat-conductive film), and water may condense within the permeate side of the membrane-based water extraction device and may fall (under the force of gravity) through an outlet port located on a bottom end of the permeate-side of the membrane.

The desiccant flow path extends between the desiccant inlet and the desiccant outlet. The permeate (water) flow path extends between the permeate inlet and the permeate outlet. In certain embodiments, the permeate outlet may be located below (and on an opposite end of the membrane-based water extraction device) the permeate inlet so as to utilize the force of gravity to encourage flow of permeate out of the membrane-based water extraction device. As mentioned above, each of the desiccant flow path and the permeate flow path interface the porous membrane 633a on opposite sides thereof. By separating the desiccant fluid from the permeate flow, the membrane 633a impedes mass transfer of dissolved solids from the desiccant into the resulting permeate flow, thereby preserving the desiccant for continuous usage and preserving the purity of the captured water. Similarly, the membrane impedes migration of a gas (e.g., a sweep gas) on the permeate side of the membrane 633a from permeating into the desiccant flow.

Figure 2A:
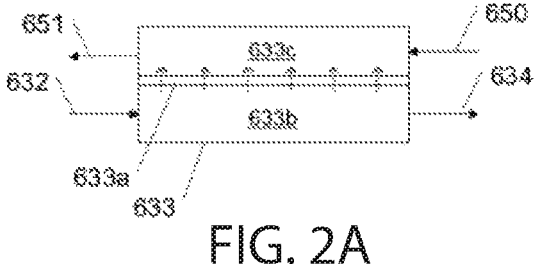
FIGS. 2A-2E illustrate example configurations of a membrane-based water extraction device according to various embodiments.

In certain embodiments, the housing defines two parallel flow paths that contact opposite sides of the porous membrane 633a in a counter-cross flow manner as illustrated in FIG. 2A, with the first flow path being the desiccant flow path 633b and the second flow path being the permeate flow path 633c, and the porous membrane 633a is embodied as a planar membrane (e.g., defined within a frame) that separates the desiccant flow path 633*b* from the permeate flow path 633*c*. In certain embodiments, the housing is configured to grant access to the porous membrane for maintenance purposes, such as to replace the membrane as needed. In other embodiments, a first flow (e.g., the desiccant flow) may flow in a horizontal direction across the surface of the membrane 633*a*) and a second flow (e.g., the permeate flow) may flow in a vertical direction across the opposite surface of the membrane, such as with the outlet of the permeate flow being below the inlet of the permeate flow.

Figure 2B:
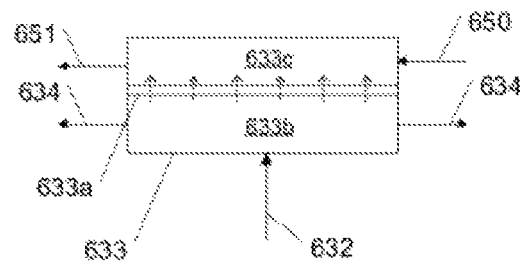

In other embodiments, the desiccant flow path may be defined by a desiccant inlet that directs the desiccant toward the membrane (e.g., at a perpendicular angle or an at least substantially perpendicular angle relative to a first side of the membrane), and the desiccant is directed toward an outlet after the desiccant contacts the membrane. This embodiment is a dead end-style flow, where inlet desiccant interfaces the porous membrane in an at least substantially normal (perpendicular) direction of the permeate flow path on the opposite side of the membrane. In this embodiment, the permeate flow path flows parallel to the porous membrane. An example of this configuration is illustrated in FIG. 2B.

Figure 2C:
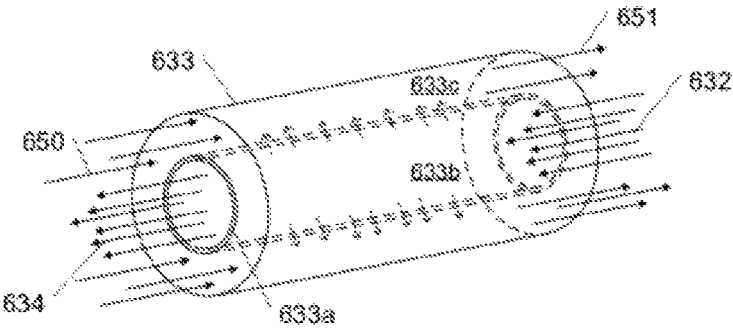

In yet other embodiments as illustrated in FIG. 2C, the housing may define a lumen-style flow path, with a first flow path being at least substantially concentric to a second flow path. Walls of the first flow path (separating the first and second flow path) may be at least partially defined by the porous membrane. In certain embodiments, the porous membrane may extend partially around the first flow path. In other embodiments, the porous membrane may extend around an entirety of the first flow path. As just one example, the first, interior flow path may be the desiccant flow path, and the second, outer flow path may be the permeate flow path, such that permeate water migrates through the porous membrane from the interior flow path to the exterior flow path. As another example, the first, interior flow path may be the permeate water flow path and the second, outer flow path may be the desiccant flow path, such that permeate water migrates through the porous membrane from the exterior flow path to the interior flow path.

In the lumen-style flow of the membrane-based water separation device, the permeate flow path and the desiccant flow paths may extend in the same co-current direction or in counter-current (opposite flow) directions. In certain embodiments, the flows may be horizontal, or vertical. In a vertical orientation, the permeate side may flow downward, thereby utilizing gravity to facilitate flow of the water (after condensation) out of the membrane-based water separation device.

To achieve separation of water from the desiccant solution, a difference in chemical potential is introduced. This may be realized in a temperature gradient across the membrane, a pressure gradient across the membrane, and/or a concentration gradient across the membrane between the desiccant flow path 633*b*, the membrane 633*a*, and the permeate flow path 633*c*. A temperature gradient across the membrane may be achieved by heating the desiccant fluid path 633*b* and/or cooling the permeate liquid water path 633*c*. The temperature of the desiccant fluid and/or the liquid water may be manipulated through the use of any heating/cooling source to include but is not limited to, heat exchangers, heating elements, waste heat, geothermal heat, solar heating, geothermal cooling, chilling, cooling pond, cooling stream, sweep gas, and/or the like. For example, the membrane-based water extraction device may incorporate a heat-exchanging configuration, such as across a non-porous film on a desiccant side of the membrane (e.g., a heating fluid may heat the desiccant fluid as it flows across a surface of the membrane) and/or a cooling configuration may be incorporated on the permeate side of the membrane (e.g., a cooling fluid separated from the permeate fluid across a non-porous film may cool the permeate fluid). A pressure gradient across the membrane may be achieved by high pressure on the desiccant side of the membrane and/or low pressure on the liquid water side of the membrane. The difference in pressure between the desiccant side of the membrane and permeate side of the membrane is not limited to but may be introduced by the following mechanisms, high pressure pumps, pumps, blowers, compressors, vacuum pumps, venturi vacuum induction mechanisms, and/or the like. Moreover, one or more pumps and/or agitators may be utilized on the desiccant side or the permeate water side to ensure homogeneity of properties of the desiccant and/or liquid water. Ultimately, the difference in pressure and/or temperature may provide a difference in vapor pressure on the two sides of the membrane so as to encourage water vapor to migrate through the membrane from the desiccant side of the membrane to the permeate/water-vapor side of the membrane. Specifically, the vapor pressure on the permeate side of the membrane may be lower than the vapor pressure on the desiccant-side of the membrane (e.g., to utilize an induced vacuum to drive permeation of the water through the membrane).

In certain embodiments, the membrane-based water extraction device is configured to utilize the mechanisms mentioned above to drive chemical potential. In one example incorporating vacuum membrane distillation (VMD), the permeate outlet path 651 is pressurized to a vacuum pressure (e.g., utilizing one or more vacuum pumps located downstream of the membrane-based water extraction device 633 along the permeate flow path, such as at compressor 652) to induce a pressure gradient across the membrane 633. As just one example, a vacuum pump may be located in the permeate water storage tank 655 and/or along flow path 659 of a gas vent from the water storage tank 655. In this embodiment, the absolute pressure on the desiccant side 633*b* is greater than the absolute pressure on the permeate side 633*c*. The interior of the membrane-based water extraction device may be analogous to that shown in FIGS. 2A-2C. In certain embodiments, additional components, such as a heating fluid flow and/or a cooling fluid flow (as discussed below) may additionally be incorporated into the VMD configuration of the membrane-based water extraction device to further enhance the efficiency of the water extraction process.

Figure 2D:
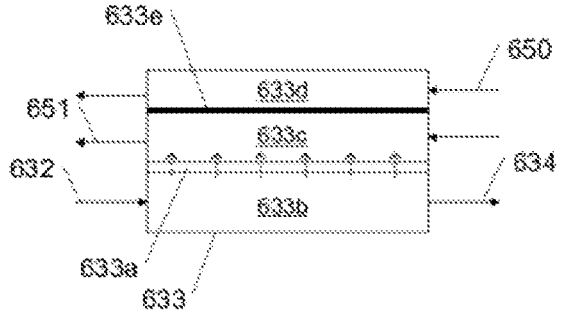
Figure 2E:
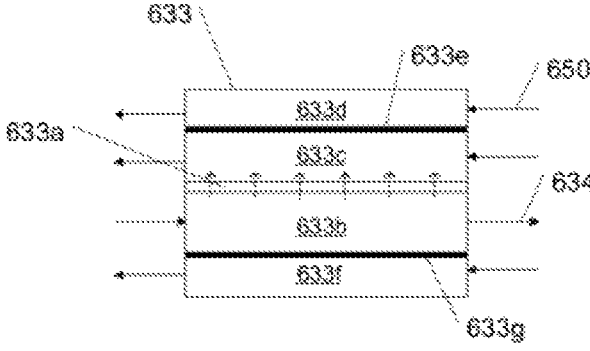

Another example embodiment utilizes air gap membrane distillation (AGMD) processes to drive permeation of water vapor across the membrane 633*a* to the permeate side 633*c* of the membrane 633*a*. Example AGMD configurations are shown in FIGS. 2D-2E, each of which provides for the permeate side of the membrane 633*c* to carry a cooling fluid along a cooling fluid flow path that is separated from the permeate flow path 633*c* by a heat-conductive, non-porous film (e.g., cooling water directed from storage tank 655, along flow path 658 to flow path 650 and into the membrane-based water extraction device 633 on the permeate side 633*c* of the membrane 633*a*). The cooling fluid flowing along flow path 633*d* sandwiches an air gap between a non-porous membrane 633*e* (separating the cooling fluid flow path 633*d* from the permeate side 633*c* of the membrane) and porous membrane 633*a*. The created air gap is formed with non-porous membranes 633*e* that promote condensing via heat transfer. The air gap serves as a path for condensates once they have separated from the desiccant via porous membrane. The cooling fluid is at a temperature below the heated desiccant fluid, thereby creating a temperature gradient starting from the heated desiccant side of the module 633*b* and finishing at the cool non-porous membrane holding the cooling fluid. The cool side also causes the transferred vapors to condense into a liquid state. A higher temperature gradient (a greater difference between the heated desiccant fluid and the cooling fluid) creates a greater driving force to separate water molecules within the concentrated desiccant across the porous membrane, thus achieving greater separation performance for the membrane-based water extraction device. As discussed above, the water vapor within the air gap may be directed out of the housing of the membrane-based water extraction device based on a vacuum created within the air gap, based on a sweep gas flowing through the air gap, and/or based on gravity that forces condensed water to flow downward and out through an outlet located at a bottom end of the air gap. In certain embodiments, the housing defines three outlets: a desiccant outlet (to flow path 634), a permeate outlet (to flow path 651), and a cooling fluid outlet (to recirculate cooling fluid along a cooling fluid flow path). In certain embodiments, the housing defines at least two inlets (when an inlet is not required for the permeate fluid, such as when gravity is utilized to direct the permeate fluid to exit the air gap) comprising a desiccant inlet (from flow path 632) and a cooling fluid inlet (e.g., from flow path 650). In other embodiments, the housing defines at least 3 inlets (when a permeate flow inlet is required, such as when utilizing a vacuum pressure or a sweep gas to direct the permeate out of the housing), comprising a desiccant fluid inlet (from flow path 632), a permeate fluid inlet (e.g., to enable a gas flow through the permeate side 633*c* of the membrane), and a cooling fluid inlet (e.g., from flow path 650).

Although illustrated as a flat-plane non-porous membrane 633*d*, it should be understood that the permeate side of the membrane 633*a* may be embodied as a shell-and-tube heat exchanger configuration (with the walls of the tubes embodying the non-porous film 633*e* and the cooling fluid flowing within the interior of the tubes).

Moreover, certain embodiments may provide an analogous configuration on the desiccant side of the membrane by utilizing a heating fluid separated from the desiccant by a non-porous, heat-conductive film, as shown in FIG. 2E. In such an embodiment, the heating fluid (e.g., a heating oil, steam, a heated refrigerant, and/or the like) passes along a flow path through heating fluid flow 633*f*, on an opposite side of the non-porous film 633*g* from the desiccant fluid 633*b*. The heating fluid transfers heat to the desiccant flowing through desiccant flow 633*b*, which encourages water vapor transmission across the porous membrane 633*a*. Particularly when the heating fluid flow 633*f* configuration is incorporated together with the cooling fluid flow 633*d* configuration, a large difference in chemical potential is introduced between the desiccant flow 633*b* and the permeate flow 633*c* to encourage migration of water across the membrane 633*a*. As discussed above, the water vapor within the air gap may be directed out of the housing of the membrane-based water extraction device based on a vacuum created within the air gap, based on a sweep gas flowing through the air gap, and/or based on gravity that forces condensed water to flow downward and out through an outlet located at a bottom end of the air gap. In certain embodiments, the housing defines three outlets: a desiccant outlet (to flow path 634), a permeate outlet (to flow path 651), a heating fluid outlet (e.g., to recirculate the heating fluid along a heating fluid flow path) and a cooling fluid outlet (to recirculate cooling fluid along a cooling fluid flow path). In certain embodiments, the housing defines at least three inlets (when an inlet is not required for the permeate fluid, such as when gravity is utilized to direct the permeate fluid to exit the air gap) comprising a desiccant inlet (from flow path 632), a heating fluid inlet, and a cooling fluid inlet (e.g., from flow path 650). In other embodiments, the housing defines at least four inlets (when a permeate flow inlet is required, such as when utilizing a vacuum pressure or a sweep gas to direct the permeate out of the housing), comprising a desiccant fluid inlet (from flow path 632), a permeate fluid inlet (e.g., to enable a gas flow through the permeate side 633*c* of the membrane), a heating fluid inlet, and a cooling fluid inlet (e.g., from flow path 650).

By separating the permeate flow 633*c* from the cooling fluid 633*d* as illustrated in either of FIGS. 2D-2E, the efficiency of permeation of water through the membrane may be increased due to a low vapor-pressure on the permeate side 633*c* of the membrane. A vacuum pressure, a sweep gas, and/or other flow-encouraging mechanisms may be implemented within the permeate flow 633*c* to encourage the water vapor on the permeate side 633*c* of the membrane to exit through the permeate outlet of the membrane-based water extraction device 633 and to be guided to one or more compressors (to incorporate beneficial features of mechanical vapor compression, similar to that described in co-pending U.S. patent application Ser. No. 17/552,173, filed on Dec. 15, 2021, now U.S. Pat. No. 12,276,090, the contents of which are incorporated herein by reference in their entirety). The water vapor exiting the permeate outlet of the membrane-based water extraction device may flow to one or more heat exchangers and/or one or more condensers 627 to condense the water vapor into liquid water before storing the same within storage tank 655.

Other embodiments implement direct contact membrane distillation (DCMD) processes to drive chemical potential across the membrane 633*a*. In a DCMD configuration, the permeate water side 633*c* of the membrane 633*a* carries a cooling fluid (e.g., cooling water) that directly contacts the porous membrane 633*a*. In such a configuration, water is directed from the storage tank 655 directly to the permeate flow 633*c* so as to maintain a low temperature on the permeate side 633*c* of the membrane 633*a*. Because the cooling fluid is at a lower temperature than the desiccant fluid, the cooling fluid creates a temperature gradient across the membrane 633*a*, starting from the heated desiccant side 633*b* and finishing at the direct contacting cooling fluid on the permeate side 633*c* of the membrane 633*a*. The cooling fluid may be retrieved from the storage tank 655 and directed into the membrane-based water extraction device 633 along flow paths 658 to 650 to 633*c* (and out of the membrane-based water extraction device at flow path 651). In certain embodiments, a portion of the water exiting the storage tank 655 along flow path 658 may be directed to external systems for use as liquid water. The permeate side 633*c* of the membrane 633*a* is fed by cooling fluid (e.g., liquid water from storage tank 655), which causes water vapors that have permeated through the membrane 633*a* to condense and transfer the water vapors separated from the concentrated desiccant. A higher temperature gradient (a greater difference between the heated desiccant fluid and the cooling fluid) creates a greater driving force to separate water molecules within the concentrated desiccant across the porous membrane, thus achieving greater separation performance for the membrane-based water extraction device.

Figure 1B:
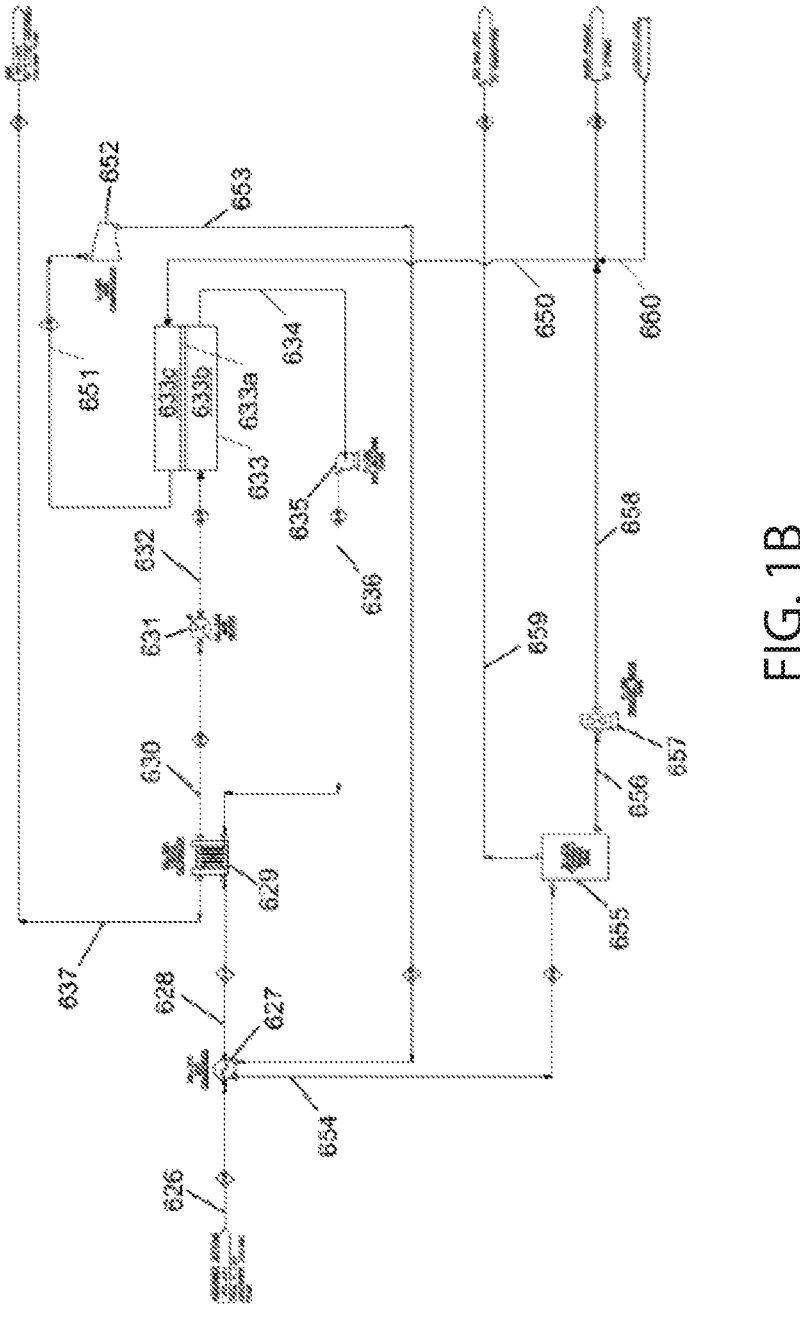

As yet another example, a sweep gas membrane distillation (SGMD) process may be utilized to create a chemical across the membrane 633a. SGMD configurations may be combined with AGMD and/or DCMD to drive further efficiency of such configurations. According to an SGMD configuration, the permeate water side 633c of the membrane 633a carries a sweep gas (e.g., nitrogen gas, high-humidity air, inert gas, and/or the like) that transports permeated fluid (e.g., water vapor) away from the porous membrane 633a after it has permeated through the porous membrane. In certain embodiments, the sweep gas may carry the permeated water vapor to a compressor 652 and/or a condenser 627, where the water vapor condenses into liquid water. The sweep gas may be separated from the permeated water vapors by bringing the mixture to the water dew point and ultimately the sweep gas may be directed away from the liquid water along flow path 659, leading out of the storage tank 655. The sweep gas may be directed back to a storage tank, and it may be recycled into the system along flow path 660 as discussed above. Condensing the permeated water vapor into liquid enables the water to be stored in the product water tank 655. In certain embodiments, the SGMD configuration utilizes an inert gaseous state fluid as a sweep gas that does not contaminate the product water. In certain embodiments of SGMD, the flow of gas into the permeate flow path 633c is heated to retain the physical state of the permeated water (vapor state). To aid in maintaining the vapor state, heat tracing elements can be utilized to prevent the fluid pipe walls from cooling the fluid to liquid state. The water vapor may then be transported to a condenser 627 down stream from the membrane-based water extraction device 633 to condense the water, which is then stored within the water storage tank 655. Moreover, in the SGMD embodiments, the sweep gas may be introduced along flow path 660 and 650 into the membrane-based water extraction device. The sweep gas may be directed away from the liquid water after condensation by directing the sweep gas out of the water storage tank, such as along flow path 659 as shown in FIG. 1B.

In certain embodiments, the water extraction module comprises one or more heating mechanisms along a flow path leading the desiccant fluid into the intake of the membrane-based water extraction device (on the desiccant side 633b of the membrane 633a). In one example embodiment, the desiccant fluid is heated to a temperature between about 40-80° C. The process may result in adequate separation even at low temperatures (approximately 40° C.). In certain embodiments, the efficiency of separation may be increased at higher temperatures (e.g., between about 60-80° C.).

For example, diluted desiccant leaving the absorber module passes through one or more heating subsystems between the absorber module and the membrane-based water extraction device. These heating subsystems are provided as a part of the water extraction module. The one or more heating subsystems may comprise one or more of: a condenser 627, a pre-extraction heat exchanger 629, and/or a heater 631. It should be understood that the one or more heating subsystems may be provided in any order relative to the flow of desiccant. In one example, the diluted desiccant, which remains cool after passing through the absorber 610, passes through a condenser 627 which utilizes the generally cool temperature of the dilute desiccant to encourage condensation of water vapor from water vapor flowing along the permeate water flow path 651-654 (e.g., the water flow path encompassing the water flow path on the second side of the porous membrane). In certain embodiments, the condenser 627 is a shell-and-tube heat exchanger, with the dilute desiccant (upstream of the membrane-based water extraction device 633) passing through the tubes, and the water vapor condensing on the exterior of the tubes within the shell of the heat exchanger. In another embodiment, the condenser 627 is a plate-and-frame heat exchanger, with the dilute desiccant fluid passing through one set of plates and the water vapor passing through the other set of plates, and the water vapor condenses in the heat exchanger as it traverses through the heat exchanger as it warms the dilute desiccant. In another embodiment, the condenser 627 is a double-pipe heat exchanger where the dilute desiccant passes through the inner pipe and the water vapor passes through the outer pipe such that it can condense on the exterior surface of the inner pipe. In certain embodiments the condenser 627 may have a counter-flow configuration (the dilute desiccant flowing in an opposite direction than the water vapor). In other embodiments, the condenser 627 may have a parallel, co-current flow configuration in which the dilute desiccant and the water vapor flow in the same direction through the condenser 627.

The dilute desiccant exiting the condenser 627 via the flow path represented at 628 has an increased temperature due to a certain amount of heat transfer that is transferred from the water vapor to the dilute desiccant within the condenser 627. The dilute desiccant then passes through a pre-evaporator heat exchanger 629 (e.g., a shell-and-tube heat exchanger, a plate-and-frame heat exchanger, a dual-tube heat exchanger (with concentric tubes), and/or the like) and/or heater 631 (e.g., an externally powered heater, such as an electric heater, a natural gas heater, a solar heater and/or the like) to increase the temperature of the dilute desiccant to or near the evaporation temperature. In certain embodiments, the heater may be an inline electric heater with heating element bundles for heating the dilute desiccant fluid. The heater may have an orientation to reduce the likelihood of fluid flashing on the elements. The heater 631 may be positioned within the housing of the membrane-based water extraction device. In certain embodiments, the heater is a heat exchanger (e.g., a shell-and-tube heat exchanger, a plate-and-frame heat exchanger, and/or the like). In certain embodiments, the heater 631 is a solar heater utilizing photovoltaic panels to generate electrical energy to drive electrical heater elements (e.g., resistive heater elements). In certain embodiments, the heater 631 is a frenal lens heater utilizing solar energy to generate thermal energy in the form of heat. In certain embodiments, the heater 631 comprises a geothermal heater mechanism comprising a series of pipes extending into the ground to utilize geothermal energy to heat the dilute desiccant fluid. In other embodiments, the heater 631 is a fired heater utilizing a hydrocarbon fuel source (e.g., natural gas, oil, wood, biomass, and/or the like) combined with oxygen (supplied from ambient air) to create heat from combustion.

In embodiments comprising both a pre-extraction heat exchanger 629 and heater 631, the dilute desiccant fluid first exits the pre-extraction heat exchanger 629 via flow path represented at 630 before entering the heater 631. Moreover, as discussed in greater detail herein, the opposite side of the pre-extraction heat exchanger 629 is provided with heated rich desiccant fluid exiting the membrane-based water extraction device.

As the desiccant flows out of the heater 631 (if used), it flows along a flow path 632 into the housing, specifically into the desiccant inlet of the membrane-based water extraction device. In the membrane-based water extraction device, the desiccant solution is brought into direct contact with the membrane. Utilizing the difference in temperature, pressure, and/or concentration, the water migrates though the membrane and is collected on the second side. The water may migrate through the membrane as a liquid and/or as a vapor. The water may then be distributed for use and/or collected in a storage tank 655. In certain embodiments, the vapor on the liquid water side of the membrane may be collected in cool liquid water or another cool fluid to condense the vapor. The vapor on the liquid water side of the membrane may be swept away from the membrane using a sweep gas that flows through the membrane-based water extraction device on the liquid water side of the membrane. The vapor may then be condensed in a further process using a heat transfer process such as a heat exchanger or other embodiment of heat transfer process to condense the water vapor into liquid water (the opposite side of the heater exchanger and/or condenser may define a portion of a flow path of a chilled fluid, such as the dilute desiccant prior to entry into the desiccant side of the membrane-based water extraction device). In certain embodiments the vapor directly enters a heat transfer process on the permeate side of the membrane after exiting the membrane-based extraction device 633. The heat transfer process may be a heat exchanger 629 or other embodiment of heat transfer process to condense the water vapor into liquid water. In other embodiments, a vacuum may be induced on the permeate side of the membrane to achieve a difference in pressure between the desiccant side and permeate side of the membrane. The water enters the membrane as a liquid and/or vapor and exits the membrane on the permeate side as a vapor. The water flow path leads the water into a storage tank 655 (via flow paths 651-654, inclusive of pump(s), heat exchanger(s) 627, compressor(s) 652, and/or other flow-assisting devices. The water flow path also circulates from the storage tank via flow path 650 (inclusive of one or more pumps in certain embodiments, not shown) to the membrane-based water extraction device 633. In certain embodiments, a sweep gas (e.g., humid air) is blown through the water flow path (e.g., via a blower in-line with the water flow path) to push water vapor out of the membrane-based extraction device 633 into the compressor 652 and ultimately into the condenser 627.

In certain embodiments, the vapor on the permeate side is compressed through mechanical and/or thermal means to a higher pressure (e.g., via compressor 652). The vapor is then passed through a heat exchanger 627 to allow the latent heat to be used to heat the desiccant solution. Through this heat exchanger the vapor is also condensed as a liquid.

The membrane-based water extraction device 633 may be configured for batch operation, wherein the desiccant circulates within a closed loop to repeatedly contact the desiccant fluid with the membrane (without directing the desiccant to the absorption module) until a desired quantity of water has been separated. Valves within the water extraction module may be configured to provide the closed-loop flow of the desiccant solution. After the concentration of the desiccant solution reaches a desired level, the desiccant solution is then sent back to the absorption module by reconfiguring the valves to enable flow of desiccant from the water extraction module to the absorption module. The membrane-based water extraction device 633 may encompass a system of parallel subunits where multiple membranes are held in a single apparatus and/or multiple membrane-based water extraction devices are operated in parallel (with each device operating to separate water from a portion of the desiccant solution). In certain embodiments the membrane separation subunits may also be configured in a series configuration. In this configuration the desiccant solution is contacted with the first membrane and a certain amount of water migrates through the first membrane. The retentate desiccant solution from the first membrane is fed to a second membrane as the desiccant solution where an additional quantity of water is separated from the desiccant solution. The process is repeated for the number of membrane separation subunits in the series setup. In certain embodiments a combination of the parallel and series units may be utilized.

In certain embodiments the membrane-based water extraction device 633 is configured for continuous operation where a stream of desiccant is flowed in direct contact (e.g., perpendicular, parallel or tangential to the membrane face) with the membrane, and water is continuously separated from the desiccant solution via the membrane. The continuous mode operation may utilize series and/or parallel subunits as described in the section above. During continuous operation, the desiccant flows in a continuous loop from the absorption module to the water extraction module and back to the absorption module.

In certain embodiments, the membrane-based water extraction device may be provided in combination with an evaporation-based water extraction device (e.g., an evaporation vessel for evaporating water from the desiccant, and a condenser for condensing the evaporated water into potable liquid water). For example, the membrane-based water extraction device may be provided upstream (along the desiccant flow path) from an evaporation vessel such as an evaporation vessel as described in co-pending U.S. patent application Ser. No. 17/552,173, filed Dec. 15, 2021, now U.S. Pat. No. 12,276,090, the contents of which are incorporated herein by reference in their entirety. The membrane-based water extraction device may alternatively (or additionally) be positioned downstream (along the desiccant flow path) of an evaporation vessel as discussed above.

Carbon Dioxide Capture

Processed air (which may comprise air exiting a water consolidation system as discussed herein) may be passed through a carbon dioxide capture system prior to exhaustion to the atmosphere. The carbon dioxide may be captured from the air for filtration and/or disposal (e.g., through one or more chemical processes to convert the carbon dioxide into water, oxygen, and/or a solid or liquid composition that may be disposed of; through capture of the carbon dioxide in a filtration media; and/or the like).

The carbon dioxide capture system may comprise a carbon dioxide capture column 102 having a fixed bed of a carbon dioxide absorbing material (e.g., a sodium hydroxide solution). As air is passed over the carbon dioxide absorbing material, the carbon dioxide is absorbed by the material. Moreover, as shown in FIG. 1, the carbon dioxide capture column 102 may be heated (e.g., with a hot fluid jacket) to facilitate increased carbon dioxide absorption by the absorbing material.

As yet other examples, the carbon dioxide capture material may be configured to reversibly absorb the carbon dioxide, such that the captured carbon dioxide may be compressed and stored as a gas for later use.

In certain embodiments, captured carbon dioxide gas may be directed to a greenhouse to optimize the internal greenhouse environment for plant growth. As discussed herein, the greenhouse may be supplied by water generated by the AWG system discussed herein.

Solar Canopy

The AWG system may be associated with a greenhouse or other agricultural system for facilitating plant growth (e.g., consumable plant growth). The greenhouse or other agricultural system for facilitating plant growth may comprise one or more features for optimizing conditions within the greenhouse for encouraging plant growth. As one example, a greenhouse may incorporate one or more features enabling sunlight control by varying light directionality, intensity, and color to facilitate achievement of ideal plant growth conditions.

Figure 4:
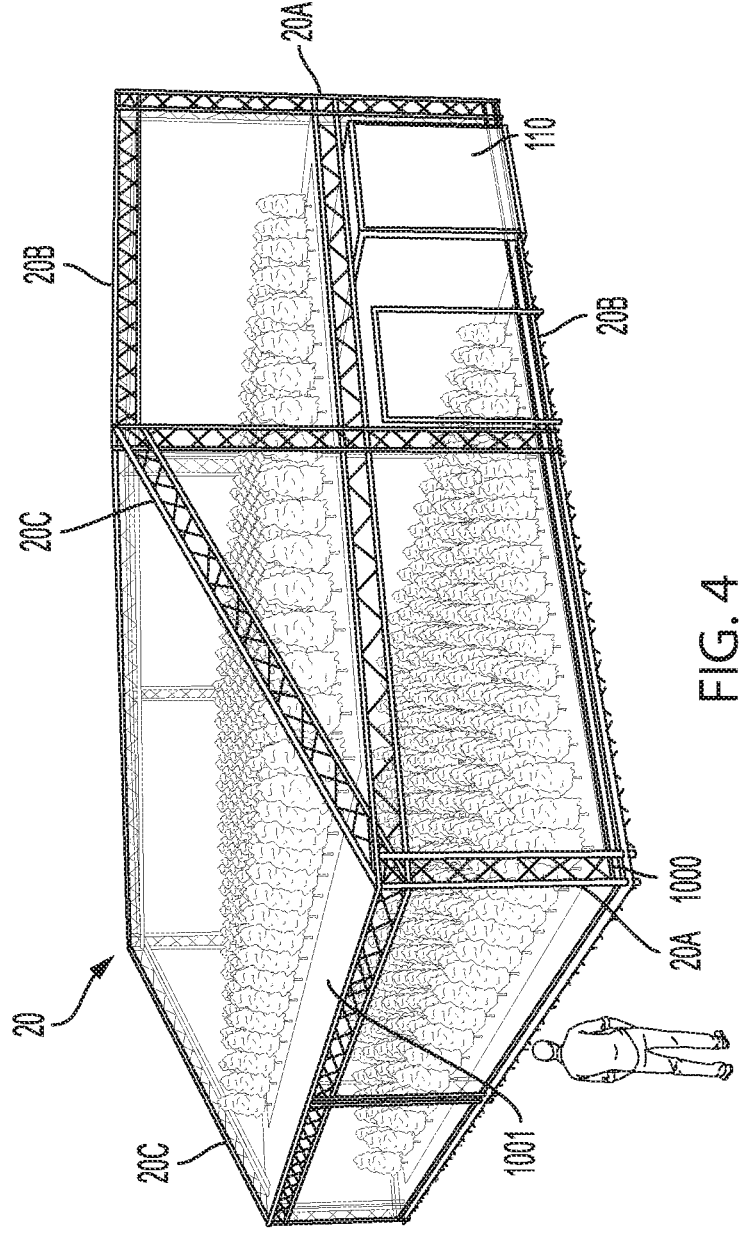
FIGS. 4-5 illustrate example growth habitats according to certain embodiments.

In various embodiments, a solar canopy may be provided as a surface covering for a plant growth habitat (e.g., greenhouse), as discussed in greater detail herein. The solar canopy may be configured to be secured to at least a portion of the support structure of the plant growth habitat. The support structure of a plant growth habitat may comprise a plurality of frame members that are connected together to form a support frame of a desired shape for receiving the solar canopy and/or other materials (e.g., structural panels, and/or the like) of the plant growth habitat. As a specific example, as shown in FIG. 4, the support structure may comprise a plurality of vertical frame members 20A (e.g., beams, pillars, and/or the like), horizontal frame members 20B, and diagonal frame members 20C that are connected together and spaced apart to form a support frame 20 that defines a perimeter of the plant growth habitat (e.g., greenhouse) and an interior of the plant growth habitat. The frame 20 may be made out of one or more of a variety of materials (e.g., metal, wood, plastic, and/or any suitable materials). In some embodiments, the frame 20 may be a rigid frame. In some embodiments, the frame 20 may be flexible. In some embodiments, the frame 20 may be collapsible (e.g., foldable).

The solar canopy may enclose the interior of the plant growth habitat (e.g., the support frame 20) to define a controlled plant growth environment within the interior of the greenhouse. In certain embodiments, the solar canopy may define a portion of the surface covering, such that the solar canopy encloses only a portion of the greenhouse, with other materials (e.g., structural panels, opaque panels, and/or the like) being used to enclose other portions of the greenhouse. However, it should be understood that the solar canopy may encompass the entirety of the surface covering to entirely (or substantially entirely) enclose the greenhouse. As discussed herein, the solar canopy may be configured for adjustment of a level of opacity thereof by the application of control signals to the solar canopy.

In various embodiments, a surface covering (e.g., covering for a greenhouse) may comprise a plurality of panels. Each panel may comprise a solar canopy 100, where the level of opacity of each panel may be independently controllable. Accordingly, the surface covering enables location-specific adjustments of opacity thereof, such that the opacity over different regions of the plant growth habitat (e.g., greenhouse) may be varied independently. In certain embodiments, the solar canopy 100 is rigid. In certain embodiments the solar canopy 100 is flexible. In certain embodiments, the surface covering may include additional features such as solar panels, lights (e.g., LED's), and/or the like.

Figure 7A:
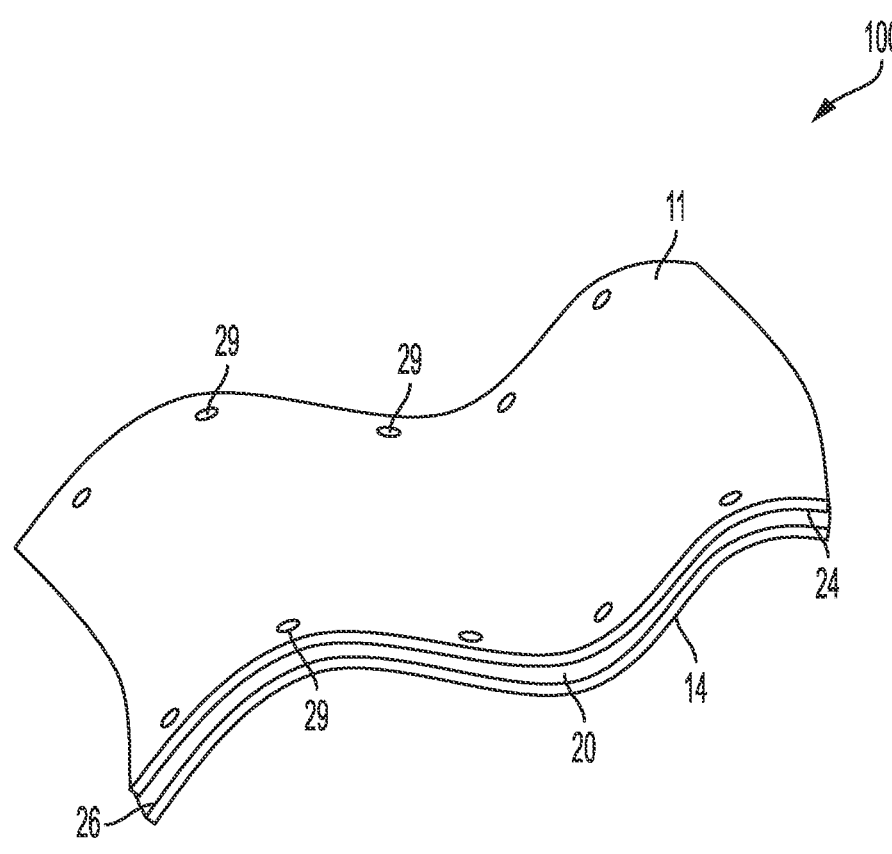
FIGS. 7A-7B illustrate example configuration of a solar canopy according to certain embodiments.
Figure 7B:
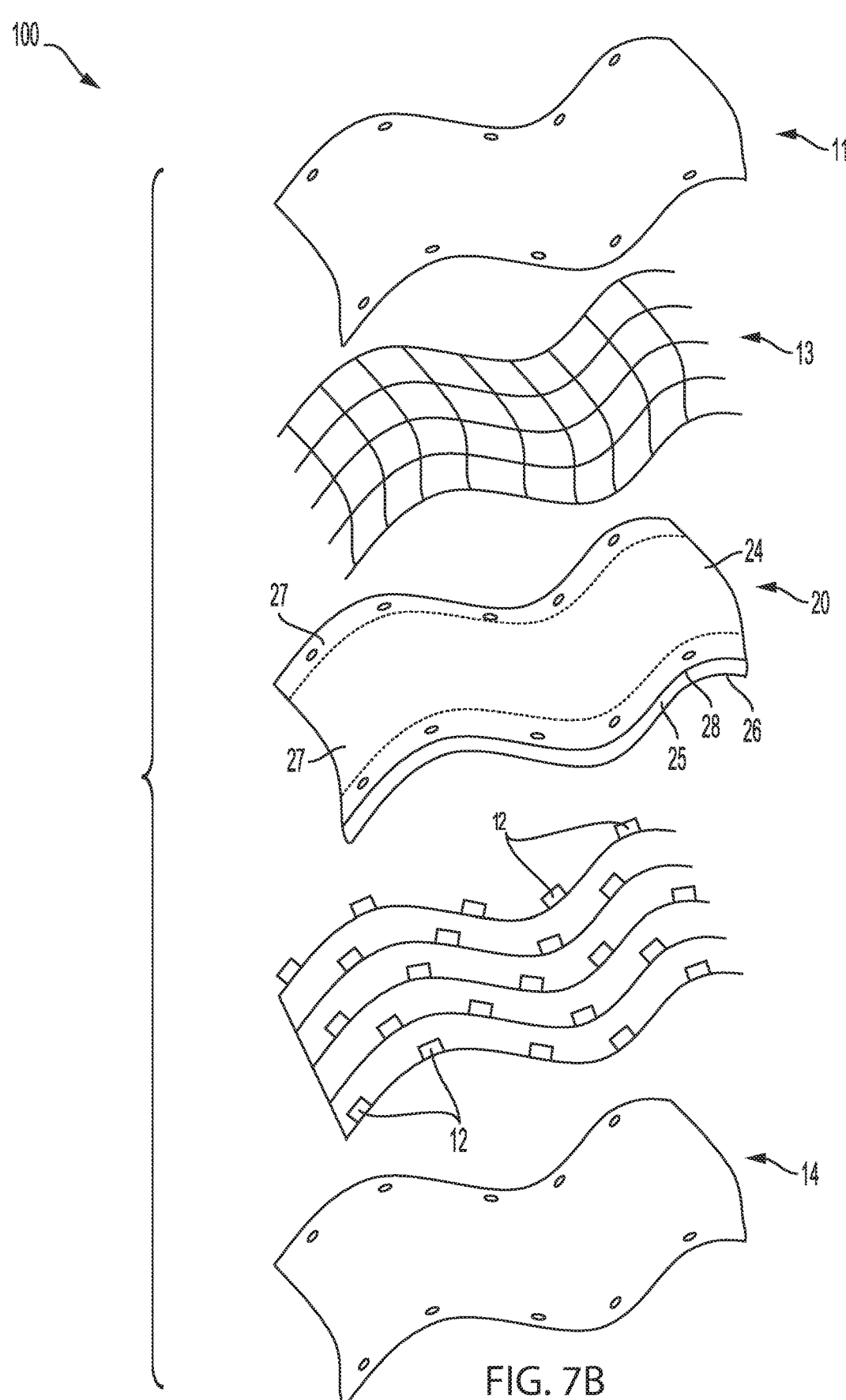

With reference initially to FIGS. 7A-7B, which depict a configuration of a solar canopy 100, in which the solar canopy is flexible, as shown therein, the solar canopy 100 may comprise a flexible film 20 comprising an opacity-tunable fluid 28. The solar canopy 100 may additionally comprise photovoltaic elements 13, LED elements 12, a first flexible protective sheet 11, and a second flexible protective sheet 14. The flexible film 20 may comprise a first flexible film layer 24 (e.g., flexible sheet) having an outer side and an inner side, a second flexible film layer 26 (e.g., flexible sheet) having an outer side and an inner side. The first flexible film layer 24 and the second flexible film layer 26 may be secured relative to each other along the edges of the flexible film layers 24, 26 with the respective inner sides facing each other. The first flexible film layer 24 and the second flexible film layer 26 may be secured relative to each other using one or more of a variety of methods (e.g., heat sealing, and/or the like). The first flexible film layer 24 may define the top surface of the flexible film 20 and the second flexible layer 26 may define the bottom surface of the film 20. The first flexible film layer 24 and the second flexible film layer 26 may comprise transparent and/or translucent material, such that sunlight may be enabled to pass through the respective flexible film layers 24, 26. The first flexible film layer 24 and/or the second flexible film layer 26 may be made from or otherwise comprise one or more of a variety of materials (e.g., flexible PVC, low density polyethylene, polyolefin, plastic, wax paper, and/or other suitable materials). In certain embodiments, the thickness of the first flexible film layer 24 and the thickness of the second flexible film layer 26 may be the same. In certain embodiment, the thickness of the first flexible film layer 24 and the thickness of the second flexible film layer 26 may be different. For example, in certain embodiments, the first flexible film layer 24 and/or the second flexible film layer 26 may have a thickness in a range of 1 mm to 4.5 mm. As another example, in certain embodiments, the first flexible film layer 24 and/or the second flexible film layer 26 may have a thickness in a range of 3 mm to 4.5 mm. As yet another example, in certain embodiments, the first flexible film layer 24 and/or the second flexible film layer 26 may have a thickness in a range of 1.5 mm to 4 mm. In various embodiments, the film 20 may have an overall thickness in a range of 1 mm to 5 mm.

The film 20 may define a sealed enclosed interior 25 configured to house the opacity-tunable fluid 28. As a specific example, the opposing flexible film layers 24, 26 may be secured relative to each other along lines 27 provided parallel with and spaced a distance away from the edges of the flexible film layers 24, 26 to define the sealed enclosed interior 25. For example, the flexible film layers 24, 26 may be heat sealed, sewn together, melted together, and/or the like along the lines 27. It should be understood that in certain embodiments, the enclosed interior 25 may comprise the entire interior defined by the flexible film layers 24, 26. In certain embodiments, the enclosed interior 25 may have a height in a range of 10 microns to 50 microns, such that the thickness of the opacity-tunable fluid 28 disposed within the enclosed interior 25 may have a thickness in a range of 10 microns to 50 microns. In certain embodiments, the enclosed interior 25 may have a height in a range of 30 microns to 50 microns, such that the opacity-tunable fluid 28 disposed within the enclosed interior 25 may have a thickness in a range of 30 microns to 50 microns. In certain embodiments, the enclosed interior 25 may have a height in a range of 20 microns to 40 microns, such that the thickness of the opacity-tunable fluid 28 disposed within the enclosed interior 25 may be in range of 20 microns to 40 microns.

In certain embodiments, the flexible film layers 24, 26 may comprise a conductive material, where the film 20 may be in electrical communication with a voltage/power source (e.g., an electric field generator, battery, and/or the like) to enable the transfer of external signals (e.g., electric signals) to the opacity-tunable fluid 28. For example, in certain embodiments, the flexible film layers 24, 26 may be made from a conductive material. As another example, in certain embodiments, the inner sides of the flexible film layers 24, 26 may be coated with a conductive material (e.g., copper, nickel, and/or the like). As yet another example, in certain embodiments, one or more electrodes (e.g., transparent electrodes) may be embedded within the solar canopy 100 (e.g., within and/or between the flexible film layers), where the electrodes may be in communication with a voltage source (e.g., an electric field generator, battery, and/or the like). In various embodiments, the electrodes and/or flexible film 20 (e.g., conductive material thereof) may be in electrical communication with the voltage source via one or more electrical connectors (e.g., electrical leads). As further discussed below, the opacity-tunable fluid 28 may be reactive to signals (e.g., electric field, and/or the like) in a manner that affects the opacity of the fluid, such that the level of opacity of the solar canopy 100 may be controllable based at least in part on the electric signal.

In various embodiments, the solar canopy 100 may additionally comprise one or more electrical layers. In certain embodiments, the solar canopy 100 may comprise a layer of photovoltaic elements 13 (e.g., strips, patches, and/or the like) as an array of photovoltaic elements 13 configured to collect sunlight. The layer of photovoltaic elements 13 may be flexible and may be secured relative to the outer side of the first flexible film layer 24. Accordingly, the photovoltaic elements 13 may have a collection side facing an outer side of the solar canopy 100 (e.g., facing an exterior of a greenhouse, when the solar canopy 100 encloses a greenhouse). The photovoltaic elements 13 may be spaced apart from one another as desired, such that sunlight is enabled to pass between the photovoltaic elements 13 and through the solar canopy 100. For example, the photovoltaic elements 13 may be spaced at regular intervals. A first flexible protective sheet 11 having an outer side and an inner side may be secured to the layer of photovoltaic elements 13 (e.g., to protect the photovoltaic elements from damage). In certain embodiments, the edges of the first flexible protective sheet 11 may be secured to the edges of the first flexible film layer 24, and the layer of photovoltaic elements 13 may be embedded between the first flexible protective sheet 11 and the first flexible film layer 24. The first flexible protective sheet 11 may be made from material that may enable sunlight to pass therethrough. In certain embodiments, the first flexible protective sheet 11 may be made from or otherwise comprise a woven-based-material (e.g., polyester woven coated with polyvinyl chloride (PVC), fiberglass woven coated with polytetrafluoroethylene (PTFE), low-density polyethylene, woven carbon fiber, and/or the like), a non-woven material (e.g., a high-strength plastic membrane, and/or the like), thin foils (e.g., ethylene-tetra-fluorine-ethylene (ETFE) foils, polyolefin, and/or the like), and/or other suitable materials. In certain embodiments, the first flexible protective sheet 11 may additionally comprise one or more coating coverings (e.g., polyvinylidene difluoride (PVDF), ethylene chlorotrifluoroethylene (ECTFE), and/or the like) configured to protect the first flexible protective sheet 11 from water, UV radiation, and pollutants.

Certain embodiments may utilize highly reflective materials or plastics to help focus light locally on to the photovoltaic elements (e.g., PV strips) or other embedded features within the solar canopy 100. For example, a photovoltaic strip (e.g., a 0.25-inch PV strip) may be flanked by reflective materials (e.g. 1 inch strips of highly reflective material) which can concentrate and focus light on to the photovoltaic strip (e.g., 0.25 inch PV strip). This can serve to enhance the efficiency of the PV collection. In certain embodiments, the photovoltaic strip and/or the strips of highly reflective material may be built at an angle (e.g., 15 degrees) such that light may be reflected in certain areas of the solar canopy 100.

The photovoltaic elements 13 may be electrically connected to one or more conductors (not shown) embedded within the solar canopy 100 (e.g., between the outer side of the first flexible film layer 24 and the inner side of the first flexible protective sheet 11) configured to direct electricity away from the photovoltaic elements 13. The one or more conductors may be provided in series with the photovoltaic elements 13, in parallel with the photovoltaic elements 13, or in a separate circuit from the photovoltaic elements 13.

As noted above, the photovoltaic elements 13 may be configured to direct electricity away from the photovoltaic elements 13. In certain embodiments, the electricity may be directed to a storage device, such as a battery and/or an uninterruptible power supply (UPS) for later use by various portions of the AWG system, the plant growth habitat, and/or the like. In certain embodiments, the electricity may be provided as Direct Current (DC) for storage and/or use. In certain embodiments, the generated DC electricity may be provided to a power converter configured to convert the DC electricity into Alternating Current (AC) energy for use by various components and/or to be supplied to a connected power grid. For example, in certain embodiments, one or more batteries and/or one or more UPS devices may be in electrical connection with a solar canopy 100 via at least one or more electrical connectors, wherein the one or more batteries are configured to store at least a portion of the electrical energy.

In certain embodiments, the solar canopy 100 may comprise a layer of LED elements 12 (e.g., as an array of LED elements/LEDs 12) configured to emit light from and/or through at least a portion of the solar canopy 100. The layer of LEDs may be flexible and may be secured relative to the outer side of the second flexible film layer 26. A second flexible protective sheet 14 having an outer side and an inner side may be secured to the layer of LED elements 12 (e.g., to protect the LED elements from damage). In certain embodiments, the edges of the second flexible protective sheet 14 may be secured to the edges of the second flexible film layer 26, and the layer of LED elements 12 may be embedded between second flexible film layer 26 and the second flexible protective sheet 14. The second flexible protective sheet 14 may be made from material that may enable sunlight to pass therethrough. In certain embodiments, the second flexible protective sheet 14 may be made from or otherwise comprise a woven-based-material (e.g., polyester woven coated with polyvinyl chloride (PVC), fiberglass woven coated with polytetrafluoroethylene (PTFE), low-density polyethylene, woven carbon fiber, and/or the like), a non-woven material (e.g., a high-strength plastic membrane, and/or the like), thin foils (e.g., ethylene-tetra-fluorine-ethylene (ETFE) foils, polyolefin, and/or the like), and/or other suitable materials. In certain embodiments, the second flexible protective sheet 14 may additionally comprise a coating covering (e.g., polyvinylidene difluoride (PVDF), ethylene chlorotrifluoroethylene (ECTFE), and/or the like) configured to protect the second flexible protective sheet 14 from water, UV radiation, and pollutants.

Figure 5:
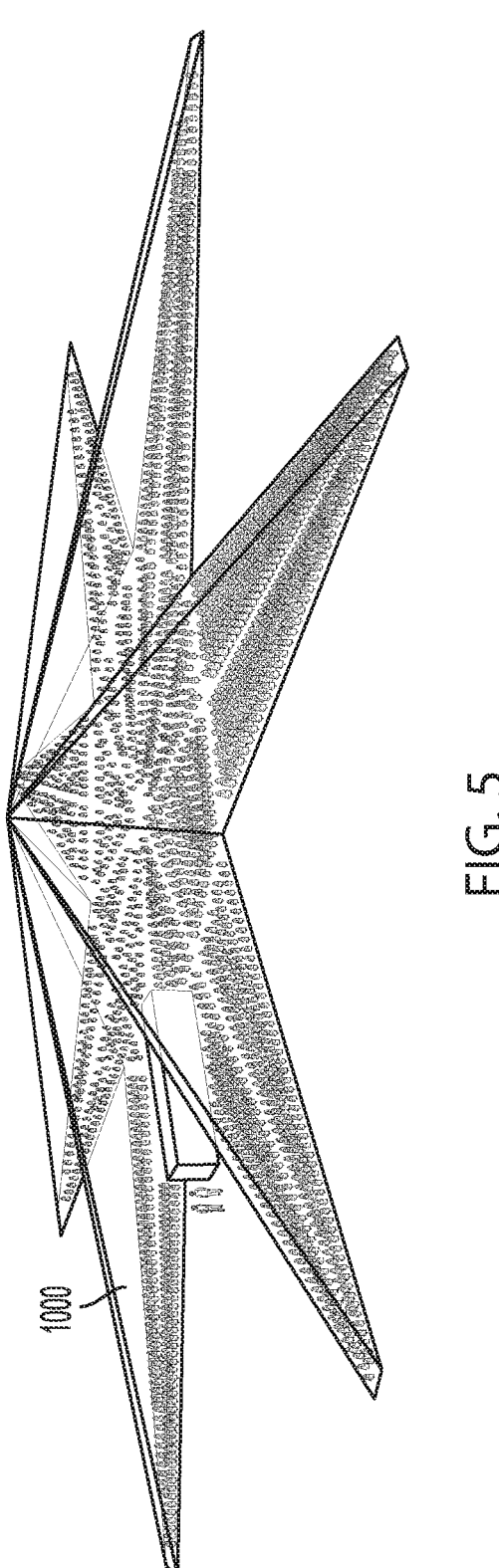

In certain embodiments, the LEDs 12 may be directed through an inner side of the solar canopy 100 (e.g., through a second flexible protective sheet 14, such as into an interior of a greenhouse, in embodiments in which the solar canopy encloses a greenhouse), opposite the outer side of the solar canopy 100, such that the LEDs 12 emit light through the inner side of the solar canopy 100. In certain embodiments the LEDs 12 may be aligned with the one or more photovoltaic elements 13 and may be configured to emit light toward a back side of the photovoltaic elements 13, such that the light reflects off of the back side of the photovoltaic elements and through the inner side of the solar canopy 100. The LEDs 12 may additionally be connected to one or more conductors (which may be provided in series with the photovoltaic elements 13, in parallel with the photovoltaic elements 13, or in a separate circuit from the photovoltaic elements 13). In certain embodiments, the LEDs 12 may receive electrical power from the plurality of photovoltaic elements 13. Additionally or alternatively, in certain embodiments, various LEDs may be suspended from the solar canopy 100 (e.g., into an interior of a greenhouse). For example, LEDs may be suspended within a growth habitat of an agricultural module 1000 (as shown in FIGS. 4-5) surrounded by one or more solar canopy 100, such that the LEDs provide additional light to plants growing therein from additional angles (e.g., proximate a growth medium in which the plants are growing).

The solar canopy 100 may comprise one or more attachment mechanisms for securing the solar canopy 100 to the frame 20 of the greenhouse and/or to another solar canopy 100. As a specific example, as shown in FIGS. 7A and 7B, the solar canopy 100 may define a plurality of openings 29 (e.g., attachment mechanism) therethrough each layer of the solar canopy 100 configured for securing (along with one or more fasteners and/or other attachment members) the solar canopy 100 to the frame 20 of a plant growth habitat (e.g., greenhouse) and/or to adjacent solar canopy 100 (if any). As shown in FIGS. 7A and 7B, the openings 29 may be spaced a distance away from the edges (e.g., 1 inch) of the solar canopy 100 and may be spaced along a line provided parallel with each of the edges of the solar canopy 100. However, it should be understood that the solar canopy 100 may be attached to the frame 20 and/or adjacent solar canopy 100 via one or more of a variety of other attachment methods or attachment mechanisms.

Figure 8A:
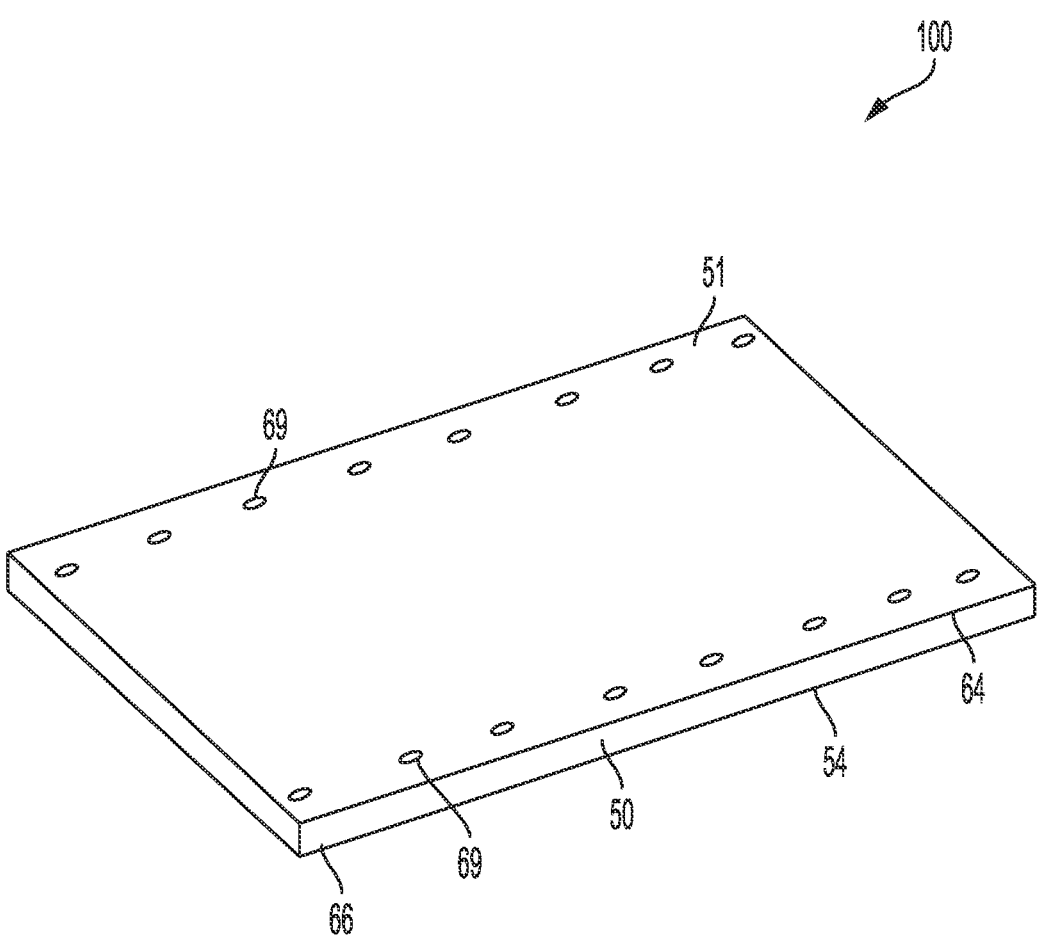
FIGS. 8A-8B illustrate example configuration of a solar canopy according to certain embodiments.
Figure 8B:
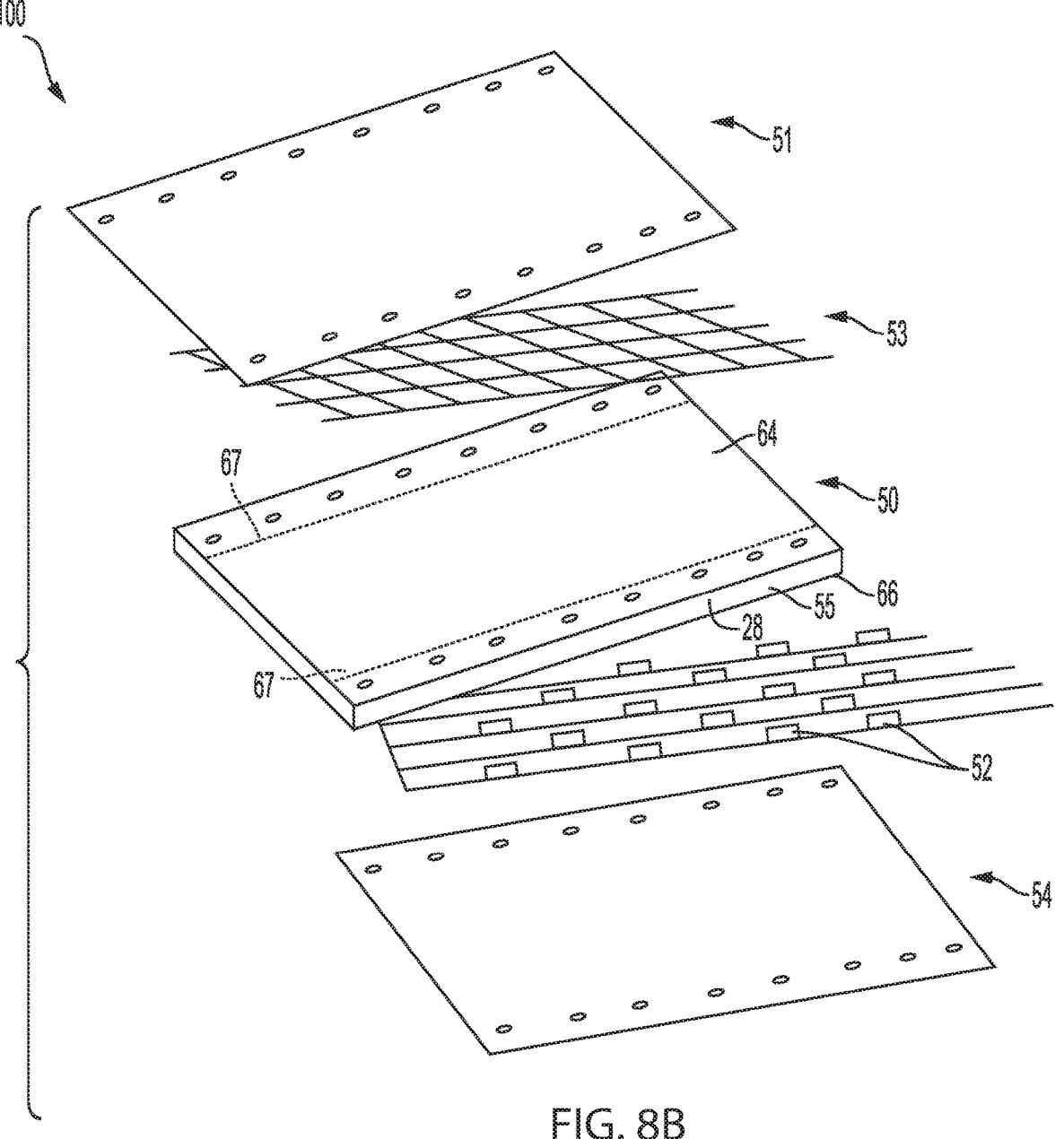

FIGS. 8A-8B illustrate an alternative configuration of a solar canopy 100, in which the solar canopy is rigid. As shown therein, the solar canopy 100 comprises a first rigid film 50 comprising an opacity-tunable fluid 28. The solar canopy 100 may additionally comprise photovoltaic elements 53, LED elements 52, a first rigid protective sheet 51, and a second rigid protective sheet 54. The rigid film 50 may comprise a first rigid film layer 64 (e.g., rigid sheet) having an outer side and an inner side, and a second rigid film layer 66 (e.g., rigid sheet) having an outer side and an inner side. The first rigid film layer 64 and the second rigid film layer 66 may be secured relative to each other along the edges with the respective inner sides facing each other. The opposing rigid film layers 64, 66 may be secured relative to each other using one or more of a variety of methods (e.g., heat sealing, and/or the like). The first rigid film layer 64 may define the top surface of the rigid film 50 and the second rigid film layer 66 may define the bottom surface of the rigid film 50. The first rigid film layer 64 and the second rigid film layer 66 may comprise transparent and/or translucent material such that sunlight may be enabled to pass through the respective rigid film layers 64, 66. In certain embodiments, the first rigid film layer 64 and/or the second rigid film layer 66 may be made from or otherwise comprise one or more of a variety of materials (e.g., fiberglass material, PVC film, high-density polyethylene, polyethylene terephthalate film, and/or other polymers).

The rigid film 50 may define a sealed enclosed interior 65 configured to house the opacity-tunable fluid 28. As a specific example, the opposing rigid film layers 64, 66 may be secured relative to each other along lines 67 provided parallel with and spaced a distance away from the edges (e.g., greater than 1 inch) of the rigid film layers 64, 66. For example, the rigid film layers 64, 66 may be heat sealed, sewn together, melted together, and/or the like along the lines 67. It should be understood that in certain embodiments, the enclosed interior 65 may comprise the entire interior defined by the rigid film layers 64, 66.

In certain embodiments, the rigid film layers 64, 66 may comprise a conductive material, where the film 50 may be in electrical communication with a voltage/power source (e.g., an electric field generator, battery, and/or the like) to enable the transfer of electric signals to the opacity-tunable fluid 28. For example, in certain embodiments, the rigid film layers 64, 66 may be made from a conductive material. As another example, in certain embodiments, the inner sides of the rigid film layers 64, 66 may be coated with a conductive material (e.g., copper, nickel, and/or the like). As yet another example, in certain embodiments, one or more electrodes may be embedded within the solar canopy 100 (e.g., within and/or between the rigid film layers 64, 66), where the electrodes may be in communication with a voltage source (e.g., an electric field generator, battery, and/or the like). In various embodiments, the one or more electrodes may be transparent electrodes. In various embodiments, the electrodes and/or rigid film 50 may be in electrical communication with the voltage/power source via one or more electrical connectors (e.g., electrical leads). As noted above and further discussed below, the opacity-tunable fluid 28 may be reactive to signals (e.g., electric field, and/or the like) in a manner that affects the opacity of the fluid, such that the level of opacity of the solar canopy 100 may be controllable based at least in part on the electric signal.

In various embodiments, the rigid solar canopy 100 configuration depicted in FIGS. 8A-8B may additionally comprise one or more electrical layers. In certain embodiments, the solar canopy 100 may comprise a rigid layer of photovoltaic elements 53 (e.g., strips, patches, and/or the like) as an array of photovoltaic elements 53 configured to collect sunlight. The rigid layer of photovoltaic elements 53 may be secured relative to the outer side of the first rigid film layer 64. Accordingly, the photovoltaic elements 53 may have a collection side facing an outer side of the solar canopy 100 (e.g., facing an exterior of a greenhouse, when the solar canopy 100 encloses a greenhouse). The photovoltaic elements 53 may be spaced apart from one another as desired, such that sunlight is enabled to pass between the photovoltaic elements 53 and through the solar canopy 100. For example, the photovoltaic elements 53 may be spaced at regular intervals. A first rigid protective sheet 51 having an outer side and an inner side may be secured to the layer of photovoltaic elements 53 (e.g., to protect the photovoltaic elements from damage). In certain embodiments, the edges of the first rigid protective sheet 51 may be secured to the edges of the first rigid film layer 64, and the layer of photovoltaic elements 53 may be embedded between the first rigid protective sheet 51 and the first rigid film layer 64. The first rigid protective sheet 51 may be made from material that may enable sunlight to pass therethrough. In certain embodiments the first rigid protective sheet 51 may be made from and/or otherwise comprise one or more of a variety of materials (e.g., PVC film, high density polyethylene, and/or the like).

The photovoltaic elements 53 may be electrically connected to one or more conductors (not shown) embedded within the solar canopy 100 (e.g., between the outer side of the first rigid film layer 64 and the inner side of the first rigid protective sheet 51) configured to direct electricity away from the photovoltaic elements 53. The one or more conductors may be provided in series with the photovoltaic elements 53, in parallel with the photovoltaic elements 53, or in a separate circuit from the photovoltaic elements 53.

As noted above, in certain embodiments, the photovoltaic elements 53 may be configured to direct electricity away from the photovoltaic elements 53. In certain embodiments, the electricity may be directed to a storage device, such as a battery and/or a UPS for later use by various portions of the AWG system, the plant growth habitat, and/or the like. In certain embodiments, the electricity may be provided as Direct Current (DC) for storage and/or use. In certain embodiments, the generated DC electricity may be provided to a power converter configured to convert the DC electricity into Alternating Current (AC) energy for use by various components and/or to be supplied to a connected power grid. For example, in certain embodiments, one or more batteries and/or one or more UPS devices may be in electrical connection with a solar canopy via at least the one or more electrical connectors, wherein the one or more batteries are configured to store at least a portion of the electrical energy.

In certain embodiments, the solar canopy 100 may comprise a layer of LED elements 52 (e.g., as an array of LED elements/LEDs 52) configured to emit light from and/or through at least a portion of the solar canopy 100. The layer of LEDs may be rigid and may be secured relative to the outer side of the second rigid film layer 66. A second rigid protective sheet 54 having an outer side and an inner side may be secured to the layer of LED elements 52 (e.g., to protect the LED elements from damage). In certain embodiments, the edges of the second rigid protective sheet 54 may be secured to the edges of the second rigid film layer 66, and the layer of LED elements 52 may be embedded between the second rigid film layer 66 and the second rigid protective sheet 54. In certain embodiments the second rigid protective sheet 54 may be made from or otherwise comprise one or more of a variety of materials (e.g., PVC film, high-density polyethylene, and/or the like).

In certain embodiments, the LEDs 52 may be directed through an inner side of the solar canopy 100 (e.g., through the second rigid protective sheet 54, such as into an interior of a greenhouse, in embodiments in which the solar canopy 100 encloses a greenhouse), opposite the outer side of the solar canopy 100, such that the LEDs 52 emit light through the inner side of the solar canopy 100. In certain embodiments the LEDs may be aligned with the one or more photovoltaic elements 53 and may be configured to emit light toward a back side of the photovoltaic elements 53, such that the light reflects off of the back side of the photovoltaic elements and through the inner side of the solar canopy 100. The LEDs 52 may additionally be connected to one or more conductors (which may be provided in series with the photovoltaic elements 53, in parallel with the photovoltaic elements 53, or in a separate circuit from the photovoltaic elements 53). In certain embodiments, the LED elements 52 may receive electrical power from the plurality of photovoltaic elements 53. Additionally or alternatively, in some embodiments, various LEDs may be suspended from the solar canopy 100 (e.g., into an interior of a greenhouse). For example, LEDs may be suspended within a growth habitat of an agricultural module 1000 (see FIGS. 4-6) surrounded by one or more solar canopy 100, such that the LEDs provide additional light to plants growing therein from additional angles (e.g., proximate a growth medium in which the plants are growing).

The rigid configuration of the solar canopy 100, as depicted in FIGS. 8A-8B may comprise one or more attachment mechanisms for securing the solar canopy 100 to the frame 20 of the greenhouse and/or to another solar canopy 100. As a specific example, as shown in FIGS. 8A and 8B, the solar canopy 100 may define a plurality spaced apart openings 69 therethrough each layer of the solar canopy 100 configured for securing (along with one or more fasteners and/or other attachment members) the solar canopy 100 to the frame 20 and/or adjacent solar canopy 100 (if any). As shown in FIGS. 8A and 8B The openings 69 may be spaced a distance away from the edges (e.g., 1 inch) of the solar canopy 100 and may be spaced along a line provided parallel with each of the edges of the solar canopy 100. However, it should be understood that the solar canopy 100 may be attached to the frame 20 and/or adjacent solar canopy 100 via one or more of a variety of other attachment methods or attachment mechanisms.

The opacity-tunable fluid 28 discussed above in reference to FIGS. 7A-7B and 8A-8B may be reactive to certain signals (e.g., electric field signals, magnetic field signals, and/or the like) applied to the fluid to change the level of opacity of the fluid, and to thereby change the level of opacity of the solar canopy 100. In various embodiments, the opacity of the solar canopy 100 may be varied during use via application of appropriate signals to the opacity-tunable fluid. As a specific example, the opacity-tunable fluid 28 may comprise a liquid crystalline fluid. The liquid crystalline fluid may comprise liquid crystal molecules (e.g., rigid-rod polymers, nanowires, nanorods, disc-shaped molecules, nanofibers, biomolecules and/or the combination thereof) having properties that enable control of the intensity of sunlight passing through the liquid crystalline fluid, and thus the opacity of the liquid crystalline fluid. For example, the liquid crystals within the liquid crystalline fluid may be characterized at least in part by positional order and orientational order of the crystals. Positional order refers to the extent to which an average molecule or group of molecules exhibits translational symmetry, while orientational order refers to a measure of the tendency of the molecules to align along the director of a long-range basis. The intensity of light allowed to pass through the liquid crystalline fluid may be dependent on the positional order and/or orientational order of the liquid crystals within the fluid.

In various embodiments, based at least in part on the physical and/or chemical properties of the liquid crystal molecules, the orientational order and positional order of the liquid crystal molecules may be controllable by the application of the certain signals (e.g., electric field, change in temperature (for thermotropic liquid crystals), fluid concentration (for lyotropic liquid crystals), light, magnetic field, and/or the like) to the liquid crystals, such that different levels of opacity of the liquid crystalline fluid may be achieved. For example, based at least in part on the type of liquid crystalline fluid within the solar canopy 100, the fluid may exhibit different liquid crystalline morphologies including, but not limited to, nematic (e.g., the molecules exhibit a long-range orientational order and a short-range positional order), smectic (e.g., the molecules exhibit both long-range orientational and positional order), cholesteric (e.g., the molecules exhibit a helical configuration), columnar, discotic, and/or the combination thereof. Examples of rod-like molecules which may form nematic phases include, but not limited to, p-azoxyanisole (PAA) and n-(p-methoxybenzylidene)-p-butylaniline (MBBA), boron nitride nanotubes and carbon nanotubes, silver nanowires, and cellulose nanocrystals.

Figures 9A, 9B, 9C:
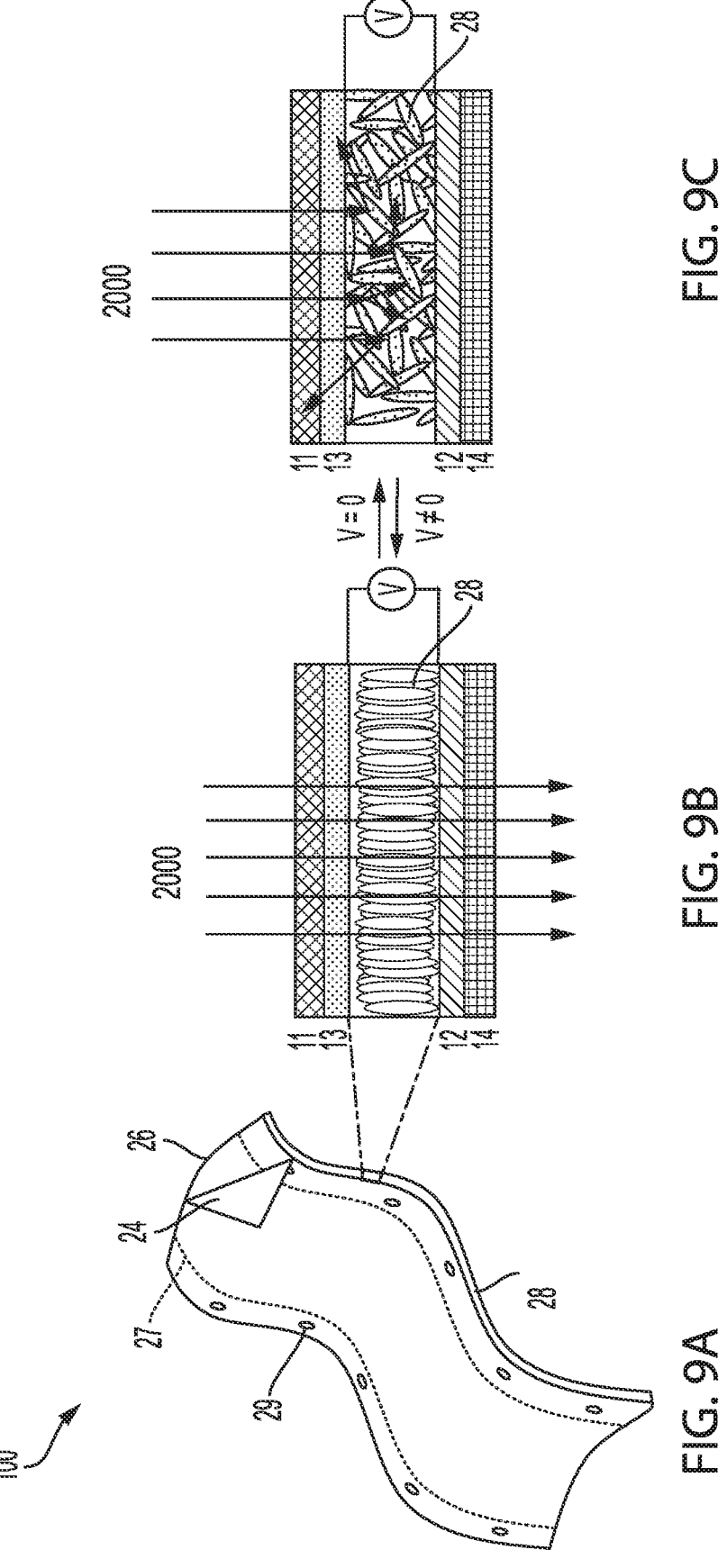
FIGS. 9A-9C illustrate an example operation for varying the opacity of a solar canopy according to certain embodiments.
Figures 10A, 10B, 10C:
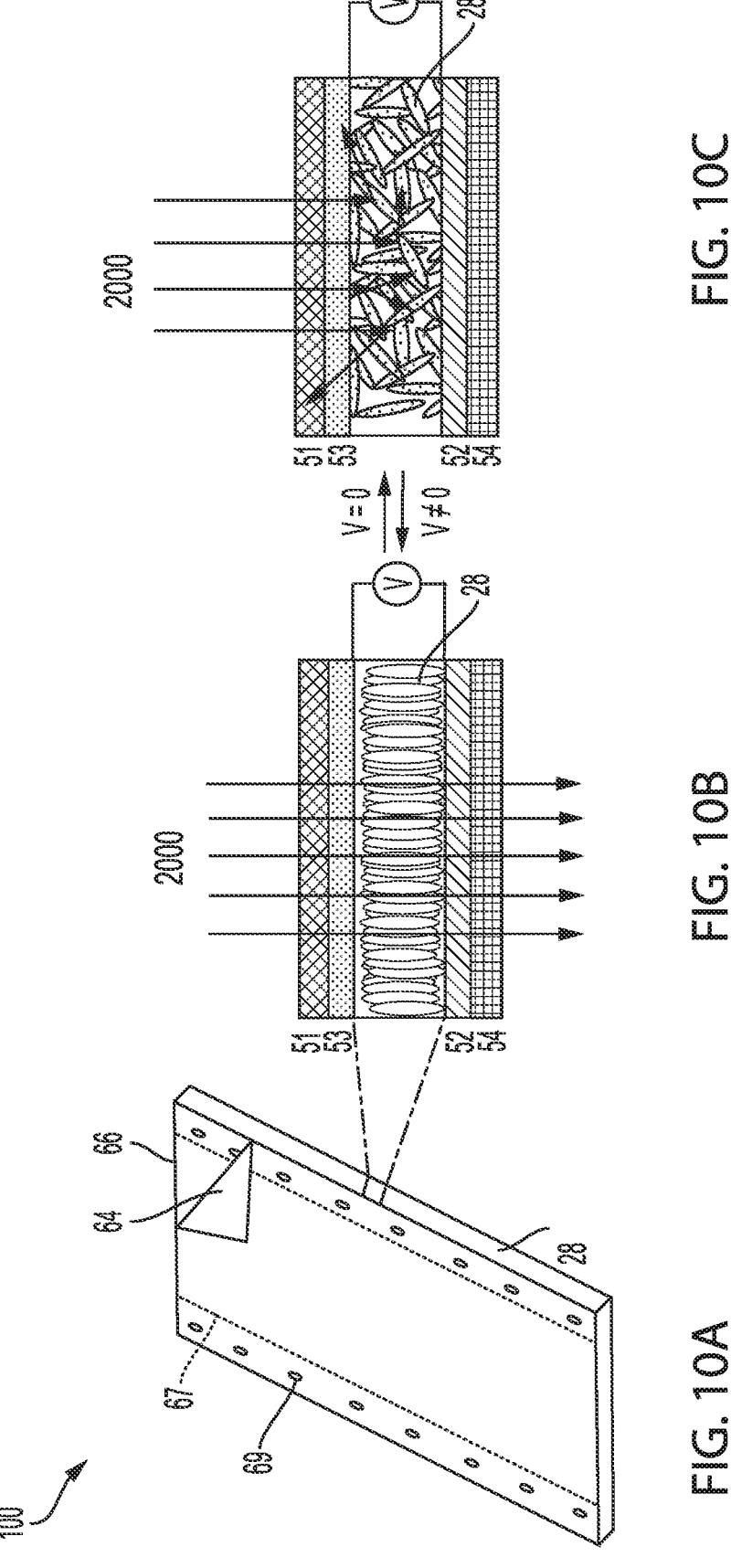
FIGS. 10A-10C illustrate an example operation for varying the opacity of a solar canopy according to certain embodiments.

FIGS. 9A-9C schematically illustrate example operation of controlling the opacity of a flexible solar canopy 100, and FIGS. 10A-10C schematically illustrate example operation of controlling the opacity of a rigid solar canopy 100, which in various embodiments, may be similar. As discussed above, the liquid crystalline fluid 28 within the solar canopy may be configured to receive an external signal (e.g., electric field, magnetic field, and/or the like) to change the orientational order and/or positional order of the liquid crystals and thus change the level of opacity of the liquid crystalline fluid (thus, the level of opacity of the solar canopy 100). Generally, the ability of molecules to align along the direction of an applied field may be primarily driven by the electromagnetic nature of the molecules. For example, when an electric field is applied, molecules consisting of induced dipoles and permanent electric dipoles tend to orient themselves along the direction of the electric field. In this manner, the molecule can lower its energy by rotating so that the dipole axis lies parallel to the field, with the positive end facing the negative electrode and vice versa (generally referred to as polarization).

As described above with reference to FIGS. 7A-7B and 8A-8B, the inner sides of the flexible film layers of the films 20, 50 may be coated with a conductive material (e.g., ITO, copper, nickel, and/or the like), and/or the flexible film layers may comprise electrodes that enable application of electric field to the liquid crystalline fluid 28. As a specific example, the film 20, 50, may comprise a negative electrode and a positive electrode that are each in electrical communication with a voltage regulator or otherwise in contact with a voltage regulator. The negative and positive electrodes may be transparent electrodes (e.g., ITO, nickel, cobalt and/or the like) and may be embedded within the film 20, 50 and/or between the corresponding film layers of the film 20, 50. The level (e.g. intensity) of opacity of the film 20, 50 (and thus the solar canopy 100) may be based at least in part on the strength of the electric voltage and may be controlled via the voltage regulator. In some embodiments, an electric field/electric signal may be applied to the opacity-tunable fluid 28 utilizing an analog system configured to enable variable levels of electric voltage between a minimum voltage level and a maximum voltage level to be selectively transmitted to the opacity-tunable fluid 28. Additionally, in certain embodiments, the solar canopy 100 may be connected to a user interface (e.g., a controllable user interface (UI)) configured to enable activation and deactivation of electric signals remotely and/or manually, such that the opacity may be varied via the analog system.

Accordingly, in various embodiments, different levels of opacity of the solar canopy 100 may be achieved by applying electric signals (as discussed above) of various voltage levels and/or various current levels to the liquid crystalline liquid 28, where a given level of opacity of the solar canopy 100 may correspond to the voltage level and/or current level of the electric signal applied. As a specific example, as shown in FIGS. 9B and 10B, when the applied electric field is at a desired maximum voltage, the film 20, 50 may exhibit a minimum level of opacity, such as about greater than 95% transparency with minimal scattering, allowing the incoming sunlight 2000 to pass through the film 20, 50 (effectively making the solar canopy almost entirely transparent or translucent). As shown in FIGS. 9B and 10B, the liquid crystal molecules are oriented allowing sunlight to pass through the film 20, 50.

As another specific example, as shown in FIGS. 9C and 10C, when no electric field is applied, such as by reducing or eliminating the electrical current imparted to the liquid crystals, the solar canopy 100 may exhibit a maximum opacity level of about less than 10% transmission with about greater than 90% scattering, allowing the incoming sunlight 2000 to completely reflect away from the solar canopy 100 (effectively making the solar canopy almost entirely opaque). As shown in the FIGS. 9C and 10C, the liquid crystal molecules are dispersed reflecting sunlight away. In certain embodiments, the incoming light 2000 may be reflected by at least one liquid crystal molecule in the fluid within the solar canopy 100, where the reflection may be caused by the refractive index mismatch between the randomly oriented liquid crystals and the material of the opacity film matrix. As noted above, the level of opacity of the solar canopy 100 can be changed to any level between the minimum opacity level and the maximum opacity level by varying the current level and/or voltage level applied to the liquid crystalline fluid 28 embedded within the solar canopy 100.

Solar irradiance generally consists of several wavelength regimes, including ultraviolet (UV<400 nm), photosynthetically active radiation (400-700 nm), and near-infrared (700-2500 nm). In various embodiments, the liquid crystalline fluid may comprise one or more nanomaterial, polymetric material (e.g., polymers), and/or dye suspended within the fluid. These nanomaterials may comprise a passive wavelength-shifting pattern configured to shift the wavelength of light passing through the solar canopy 100. In certain embodiments, the passive wavelength-shifting material (e.g., nanomaterials such as quantum dots) may be embedded within a fluid configured to absorb a photon of a given wavelength (e.g., a wavelength that cannot be utilized by a target, such as plants within the greenhouse) and emits photons in a wavelength that is usable by the target within the greenhouse. The polymeric material may be configured for shifting wavelengths up (to a longer wavelength) or down (to a shorter wavelength). For example, upshifts may be from the infrared wavelength and downshifting could be from the ultraviolet range or within the visible range of wavelengths (but in a portion of the light spectrum that cannot be utilized by plants within the greenhouse). In certain embodiments, the nanomaterial in the fluid may enable a more uniform distribution of sunlight through a diffuse scattering of sunlight via nanomaterials-doped liquid crystalline fluid within the film 20, 50 throughout or in part of the greenhouse solar canopy, resulting in increase of overall photosynthesis and production.

In alternate embodiments, the level of opacity of the solar canopy 100 may be varied by applying magnetic field signals to the opacity-tunable fluid 28. Some of the advantages of magnetically responsive liquid crystals include that they can be operated remotely by an external magnetic field, without electrodes. In certain embodiments, the liquid crystalline fluid may comprise liquid crystal molecules (e.g., rigid-rod polymers, nanowires, nanorods, disc-shaped molecules, nanofibers, biomolecules and/or the combination thereof) with variable magnetic susceptibility properties that enable the control of the intensity of sunlight passing through the liquid crystalline fluid, and thus the opacity of the liquid crystalline fluid. For example, some of the magnetic liquid crystalline molecules in a fluid may include paramagnetic materials, ferro- or ferrimagnetic inorganic materials (e.g., CdSe nanorods, FeOOH nanorods, LaPO$_4$ nanorods) for designing magnetically responsive liquid crystals.

In certain embodiments, the film layers may be exposed to a flexible magnetic actuators or magnetic coils, where the film 20, 50 may be in communication (e.g., remotely) with a magnetic field generator to enable the transfer of magnetic signals to the opacity-tunable fluid 28. For example, in certain embodiments, one or more flexible magnetic field actuators and/or coils may be embedded within the solar canopy 100 (e.g., within and/or between the film layers), where the actuators may be in communication with an amplifier and/or a capacitor to tune the intensity of input magnetic field to the magnetic liquid crystalline molecules. The orbital motion of electrons in a magnetic liquid crystalline molecule causes an induced magnetic dipole when placed in a magnetic field of typically about 1 milliTesla to 1 Tesla. The change in electron motion itself creates a magnetic field that opposes the applied magnetic field, resulting in an increase in energy of the system. Accordingly, molecules tend to align themselves so that the direction along which the electron motion is most affected lie parallel rather than normal to the field. As result, the long axes of the molecular rods will align with the applied external magnetic field. Accordingly the intensity of light enabled to pass through the films 20, 50 may be controlled via application (activation or deactivation) of a magnetic field, thus enabling control of the opacity of the solar canopy 100.

Figure 11:
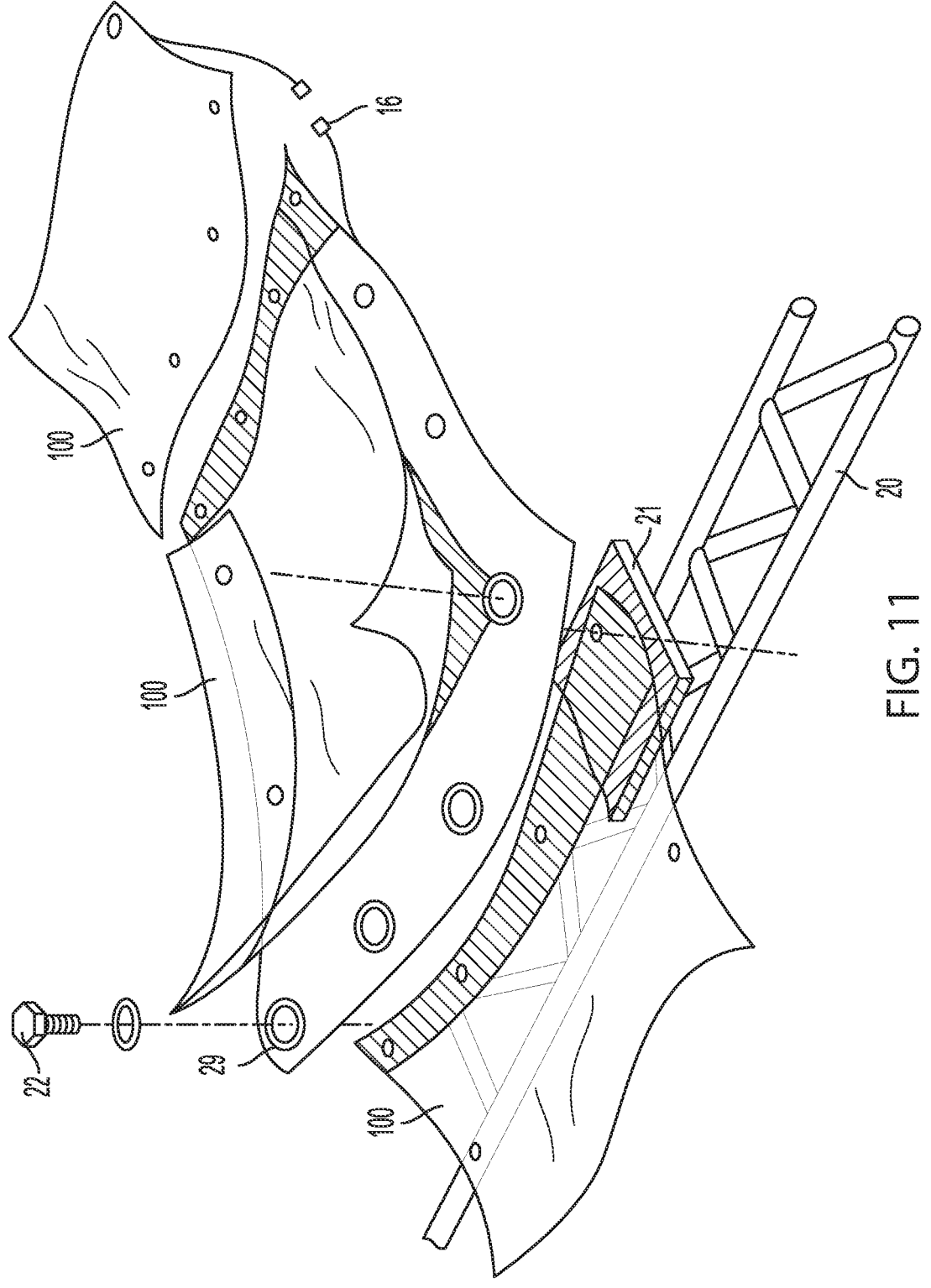
FIG. 11 illustrates example growth habitats with a solar canopy according to certain embodiments.

With reference to FIG. 11, as noted above, a plurality of solar canopy 100 may be integrated or otherwise attached together to define a portion of a surface covering or the entirety of a surface covering, where the opacity of each solar canopy 100 may be independently controllable, such that the opacity over different regions of a plant growth habitat (e.g., greenhouse) with a solar canopy 100 covering may be varied independently. In certain embodiments, the opacity of each solar canopy 100 of the surface covering may be independently controllable via one or more controllers (e.g., see FIG. 6). In certain embodiments, the one or more controllers may be in electronic communication with a voltage/power source (e.g., battery, electric field generator, and/or the like), where the one or more controllers may be configured to independently control the application of an external signal (e.g., electric field signal) from the voltage/power source to the liquid crystalline fluid 28 of the solar canopy 100. In certain embodiments, each solar canopy 100 may be associated with an identifier, where each identifier may correspond to a location of the greenhouse, such that the controller can individually control each solar canopy 100 (thus, a particular region of the greenhouse) based at least in part on the identifiers.

In certain embodiments, each solar canopy 100 configured to be integrated with another solar canopy 100 may have finished edges. The finished edges may comprise smooth edges configured to impede fraying and/or tearing. For example, the edges may be sewn, melted, and/or the like. As shown in FIG. 11, each solar canopy 100 may be attached relative to a frame 20 of a plant growth habitat (e.g., greenhouse) and/or relative to adjacent solar canopy 100 via one or more of the plurality of openings 29, 69 (i.e., attachment mechanisms) defined by the solar canopy 100. For example, a given solar canopy 100 may be secured relative to a frame 20 of the greenhouse, via one or more fasteners 22 secured relative to a mounting plate 21. In certain embodiments, the openings 29, 69 for adjacent solar canopy 100 may be configured for engagement therebetween (e.g., via one or more attachment members such as wires, ropes, cords, and/or the like), such that adjacent solar canopy 100 may be joined via the one or more fastener/attachment mechanisms. In certain embodiments, the plurality of openings 29, 69 may comprise one or more grommets to prevent tearing.

In certain embodiments, the solar canopy 100 may additionally comprise one or more electrical connection mechanisms 16 configured to enable conductors of adjacent solar canopy 100 to be connected in series. In certain embodiments, solar canopy 100 may comprise a first set of electrical connectors 16 configured for connecting conductors of the photovoltaic portion circuit for adjacent solar canopy 100, and a second set of electrical connectors 16 configured for connecting conductors of the LED lighting circuits for adjacent solar canopy 100.

Figure 12A:
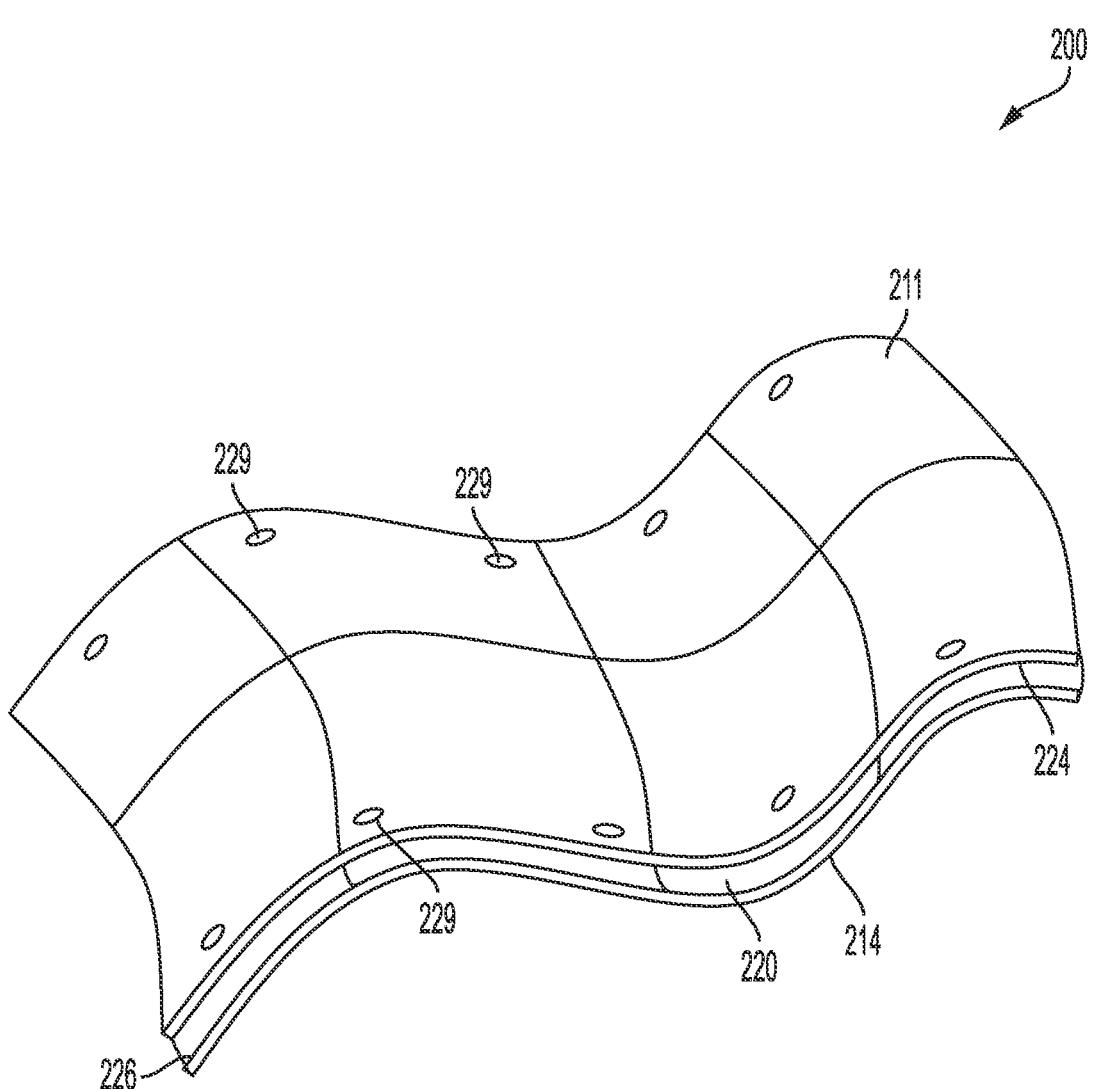
FIGS. 12A-12B illustrate example configuration of a solar canopy according to certain embodiments and FIG. 13 illustrates example growth habit with a solar canopy showing different levels of opacity at different regions of the growth habitat according to certain embodiments.
Figure 12B:
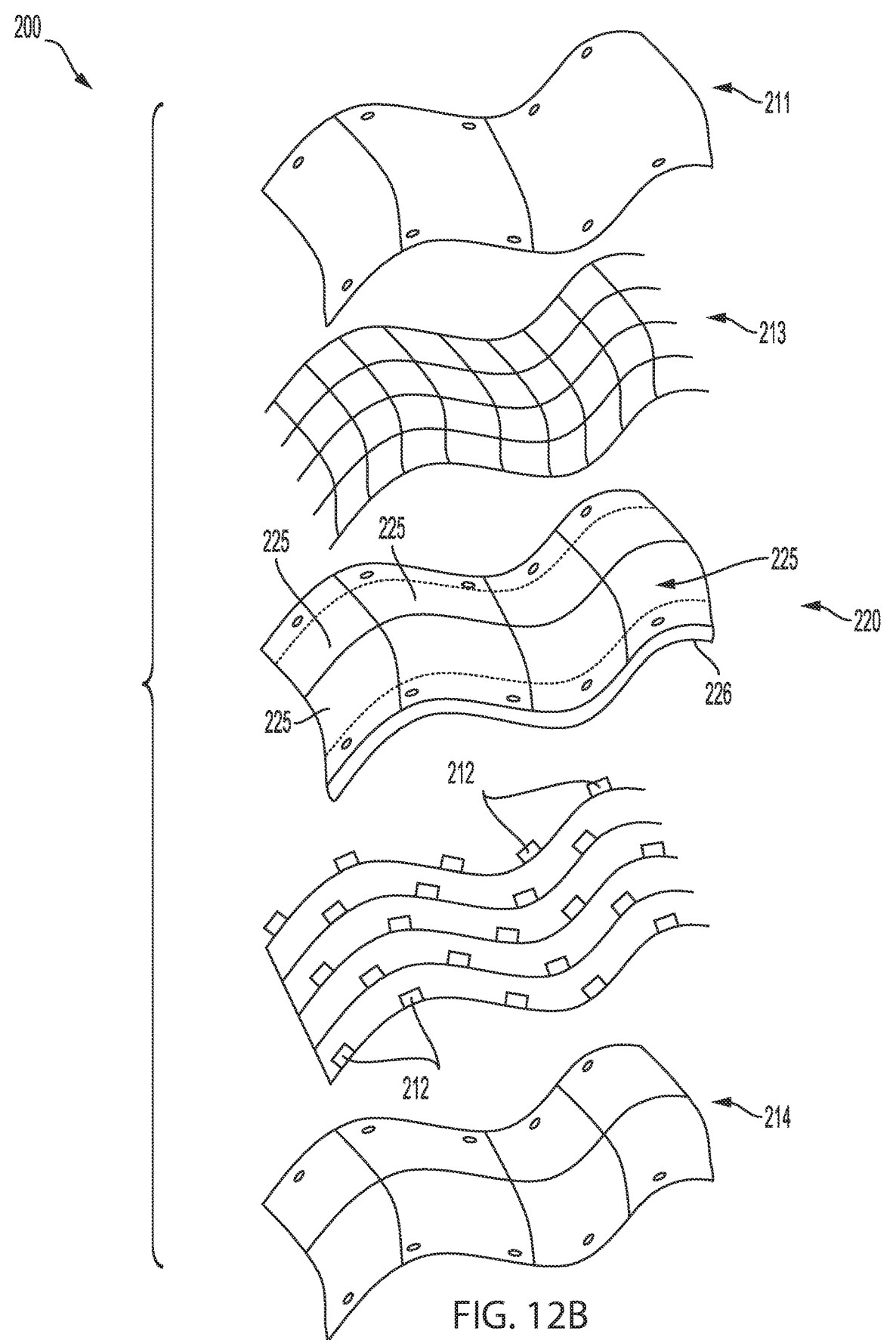

As yet another embodiment of a solar canopy, a solar canopy 200 characterized by a plurality of disjoint regions, where the level of opacity of each disjoint region may be independently controllable is provided. As described above, the solar canopy 200 may be configured to be secured to at least a portion of the support structure of a plant growth habitat (e.g., greenhouse). Accordingly, the solar canopy 200 enables location-specific adjustments of opacity thereof, such that the opacity over different regions of the plant growth habitat (e.g., greenhouse) may be varied independently. The solar canopy 200 may comprise components (e.g., attachment mechanisms 229 for securing the solar canopy 200 to the frame of a greenhouse, and the like) that are similar to the components of solar canopy 100 (described above with reference to the configurations of FIGS. 7A-7B and 8A-8B). In certain embodiments, the solar canopy 200 may be embodied as a flexible solar canopy 200. In certain embodiments the solar canopy 200 may be embodied as a rigid solar canopy 200. FIGS. 12A-12B depict a configuration in which the solar canopy 200 is embodied as a flexible solar canopy 200. While the solar canopy 200 is described below with reference to a flexible configuration, as noted above, the solar canopy 200 may be embodied as a rigid solar canopy 200.

As shown in FIGS. 12A-12B, the solar canopy 200 may comprise a flexible film 220 comprising an opacity-tunable fluid 28 (not shown) as described above. The solar canopy 200 may additionally comprise photovoltaic elements 213, LED elements/LEDs 212, a first flexible protective sheet 211, and a second flexible protective sheet 214. The flexible film 220 may comprise a first flexible film layer 224 (e.g., flexible sheet) having an outer side and an inner side, a second flexible film layer 226 (e.g., flexible sheet) having an outer side and an inner side. The first flexible film layer 224 and the second flexible film layer 226 may be secured relative to each other along the edges with the respective inner sides facing each other using one or more of a variety of methods (e.g., heat sealing, and/or the like). The first flexible film layer 224 and the second flexible film layer 226 may comprise transparent and/or translucent material, such that sunlight may be enabled to pass through the respective flexible film layers 224, 226.

The first flexible film layer 224 and/or the second flexible film layer 226 may be made from (or otherwise comprise) one or more of a variety of materials (e.g., flexible PVC, low density polyethylene, polyolefin, plastic, wax paper, and/or other suitable materials). In certain embodiments, the thickness of the first flexible film layer 224 and the thickness of the second flexible film layer 226 may be the same. In certain embodiments, the thickness of the first flexible film layer 224 and the thickness of the second flexible film layer 226 may be different. In certain embodiments, the first flexible film layer 224 and/or the second flexible film layer 226 may have a thickness in a range of 1 mm to 4.5 mm. In certain embodiments, the first flexible film layer 224 and/or the second flexible film layer 226 may have a thickness in a range of 3 mm to 4.5 mm. In certain embodiments, the first flexible film layer 224 and/or the second flexible film layer 226 may have a thickness in a range of 1.5 mm to 4 mm. In various embodiments, the film 220 may have an overall thickness in a range of 1 mm to 5 mm.

As shown in FIGS. 12A-12B, the film 220 may define a plurality of enclosed pockets 225 that are each configured to house an opacity-tunable fluid 28. Each enclosed pocket 225 may comprise a conductive material that is in electrical communication with a voltage source (e.g., an electric field generator, battery, and/or the like) to enable the transfer of electric signals to the opacity-tunable fluid 28 of the particular enclosed pocket 225. For example, in certain embodiments, for each enclosed pocket, the inner sides of the flexible film layers 224, 226 may be coated with a conductive material (e.g., copper, nickel, and/or the like). As yet another example, in certain embodiments, one or more electrodes (e.g., transparent electrodes) may be embedded within each enclosed pocket 225 (e.g., within and/or between the corresponding flexible film layers 224, 226), where the electrodes may be in communication with a voltage source (e.g., an electric field generator, battery, and/or the like). In various embodiments, the electrodes and/or flexible film 220 of each disjoint pocket 225 may be independently in electrical communication with the voltage source via one or more electrical connectors (e.g., electrical leads). As discussed above with reference to solar canopy 100 configurations, the opacity-tunable fluid 28 may be reactive to signals (e.g., electric field, and/or the like) in a manner that affects the opacity of the fluid, such that the level of opacity of each enclosed pocket 225 may be controllable based at least in part on applied electric signal. It should be understood that the operation of controlling the opacity of each enclosed pocket 225 may be similar (e.g., the same) as described above in relation to the configuration of the solar canopy 100 (FIGS. 9B-9C and 10B-10C).

The solar canopy 200 may comprise a layer of photovoltaic elements 213 (e.g., strips, patches, and/or the like) (e.g., as an array of photovoltaic elements 213) configured to collect sunlight. The layer of photovoltaic elements 213 may be flexible and may be secured relative to the outer side of the first flexible film layer 224. Additionally, in certain embodiments, the photovoltaic elements 213 may be grouped into sets of photovoltaic elements, where each set of photovoltaic elements may correspond to a particular enclosed pocket 225. The photovoltaic elements 213 may have a collection side facing an outer side of the solar canopy 200 (e.g., facing an exterior of a greenhouse, when the solar canopy 200 encloses a greenhouse). The photovoltaic elements 213 may be spaced apart from one another as desired, such that sunlight is enabled to pass between the photovoltaic elements 213 and through the solar canopy 200. For example, the photovoltaic elements 213 may be spaced at regular intervals. A first flexible protective sheet 211 having an outer side and an inner side may be secured to the layer of photovoltaic elements 213 (e.g., to protect the photovoltaic elements from damage).

The first flexible protective sheet 211 may be made from material that may enable sunlight to pass therethrough. In certain embodiments the first flexible protective sheet 211 may be made from or otherwise comprise a woven-based-material (e.g., polyester woven coated with polyvinyl chloride (PVC), fiberglass woven coated with polytetrafluoroethylene (PTFE), low-density polyethylene, woven carbon fiber, and/or the like), a non-woven material (e.g., a high-strength plastic membrane, and/or the like), thin foils (e.g., ethylene-tetra-fluorine-ethylene (ETFE) foils, polyolefin, and/or the like), and/or other suitable materials. In certain embodiments, the first flexible protective sheet 211 may additionally comprise one or more coating coverings (e.g., polyvinylidene difluoride (PVDF), ethylene chlorotrifluoroethylene (ECTFE), and/or the like) configured to protect the first flexible protective sheet 211 from water, UV radiation, and pollutants.

Each set of photovoltaic elements may be electrically connected to one or more conductors (not shown) embedded within the solar canopy 200 (e.g., within and/or between the film layers of the corresponding pocket) configured to direct electricity away from the photovoltaic elements 213. The one or more conductors may be provided in series with the photovoltaic elements 213, in parallel with the photovoltaic elements 213, or in a separate circuit from the photovoltaic elements 213).

As noted above, in certain embodiments, the photovoltaic elements 213 may be configured to direct electricity away from the photovoltaic elements 213. In certain embodiments, the electricity may be directed to a storage device, such as a battery and/or a UPS for later use by various portions of the AWG system, the plant growth habitat, and/or the like. In certain embodiments, the electricity may be provided as Direct Current (DC) for storage and/or use. In certain embodiments, the generated DC electricity may be provided to a power converter configured to convert the DC electricity into Alternating Current (AC) energy for use by various components and/or to be supplied to a connected power grid. For example, in certain embodiments, one or more batteries and/or one or more UPS devices may be in electrical connection with a solar canopy via at least the one or more electrical connectors, wherein the one or more batteries are configured to store at least a portion of the electrical energy.

In certain embodiments, the solar canopy 200 may comprise a layer of LED elements 212 (e.g., as an array of LED elements 212) configured to emit light from and/or through at least a portion of the solar canopy 200. The layer of LEDs may be flexible and may be secured relative to the outer side of the second flexible film layer 226. In certain embodiments, the LED elements may be grouped into sets of LED elements 212, where each set of LED elements 212 may correspond to a particular enclosed pocket 225. A second flexible protective sheet 214 having an outer side and an inner side may be secured to the layer of LED elements 212 (e.g., to protect the LED elements from damage).

The second flexible protective sheet 214 may be made from material that may enable sunlight to pass therethrough. In certain embodiments the second flexible protective sheet 214 may be made from or otherwise comprise a woven-based-material (e.g., polyester woven coated with polyvinyl chloride (PVC), fiberglass woven coated with polytetrafluoroethylene (PTFE), low-density polyethylene, woven carbon fiber, and/or the like), a non-woven material (e.g., a high-strength plastic membrane, and/or the like), thin foils (e.g., ethylene-tetra-fluorine-ethylene (ETFE) foils, polyolefin, and/or the like), and/or other suitable materials. In certain embodiments, the second flexible protective sheet 14 may additionally comprise a coating covering (e.g., polyvinylidene difluoride (PVDF), ethylene chlorotrifluoroethylene (ECTFE), and/or the like) configured to protect the second flexible protective sheet 14 from water, UV radiation, and pollutants.

In certain embodiments, the LEDs 212 may be directed through an inner side of the solar canopy 200 (e.g., through the second flexible protective sheet 214, such as into an interior of a greenhouse, in embodiments in which the solar canopy encloses a greenhouse), opposite the outer side of the solar canopy 200, such that the LED elements 212 emit light through the inner side of the solar canopy 200. In certain embodiments the LEDs may be aligned with the one or more photovoltaic elements 213 and may be configured to emit light toward a back side of the photovoltaic elements 213, such that the light reflects off of the back side of the photovoltaic elements and through the inner side of the solar canopy 200. The LEDs 212 may additionally be connected to one or more conductors (which may be provided in series with the photovoltaic elements 213, in parallel with the photovoltaic elements 213, or in a separate circuit from the photovoltaic elements 213). In certain embodiments, the LED elements 212 may receive electrical power from the plurality of photovoltaic elements 213.

In certain embodiments, the opacity of the individual disjoint regions (e.g., enclosed pockets 225) of the solar canopy 200 may be independently controllable via one or more controllers. In certain embodiments, the one or more controllers may be in electronic communication with a voltage/power source (e.g., battery, electric field generator, and/or the like), where the one or more controllers may be configured to independently control the application of an external signal (e.g., electric field signal) from the voltage/power source to the liquid crystalline fluid 28 of a disjoint region (e.g., enclosed pocket 225) of the solar canopy 200. In certain embodiments, each enclosed pocket 225 may be associated with an identifier, where each identifier may correspond to a location of the greenhouse, such that the controller can individually control each disjoint region of the solar canopy 200 based at least in part on the identifiers.

Figure 13:
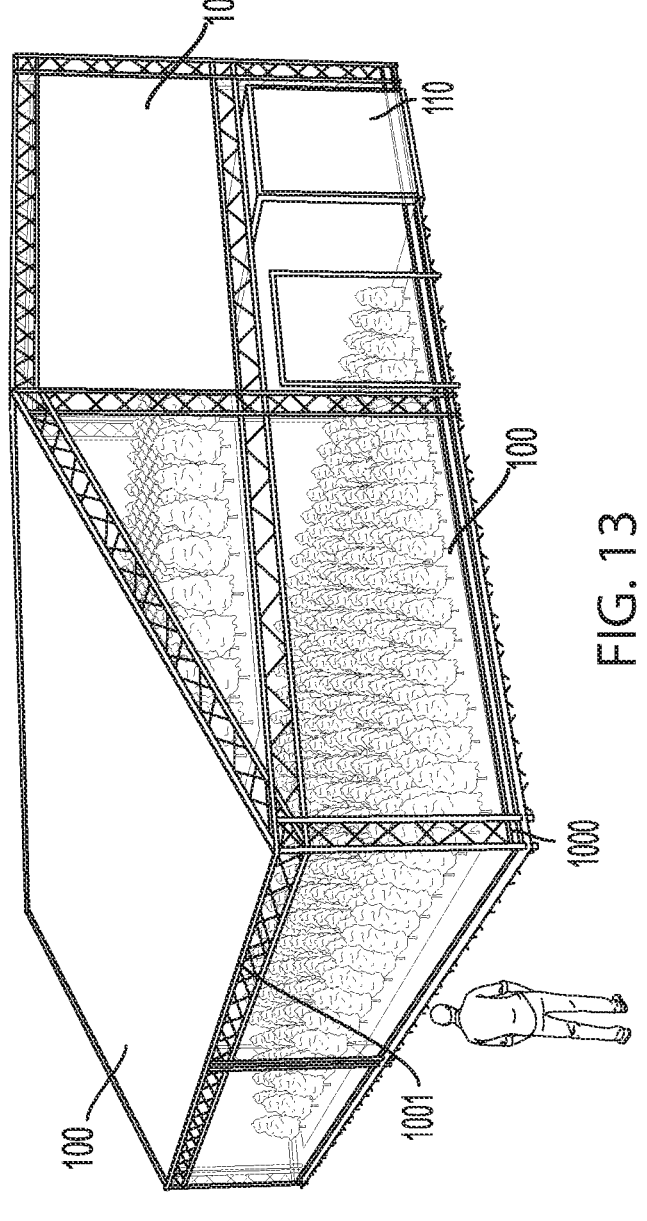

In various embodiments, the solar canopy (solar canopy 100 and/or solar canopy 200) may be utilized in a plant growth habitat (e.g., greenhouse) to control the amount of control the intensity of light and directionality with respect to different regions of the plant growth habitat. As an example, for optimum plant growth, different plants within the greenhouse may require different light intensity and directionality at different periods. As shown in FIG. 13, a greenhouse utilizing a solar canopy as discussed herein may control the opacity of the solar canopies, such that different regions have different opacity levels.

In various embodiments, the method of using a solar canopy may comprise determining the identifier associated with a solar canopy 100 or region of a solar canopy 200 (thus a particular region of greenhouse) and applying the appropriate signal (e.g., electric field) to the corresponding solar canopy and/or solar canopy region to vary the opacity of the corresponding greenhouse region.

Automated Agricultural Usage

The AWG system may be utilized to generate water and/or power to be supplied to an agricultural module, which may comprise a greenhouse, plant growth habitat, and/or other structure that may be utilized to encourage plant growth within controlled atmospheric conditions. FIGS. 4-5 illustrates various embodiments of an agricultural module 1000 in association with an AWG system 110 housed within a shipping container according to one embodiment. As shown in the figures, the agricultural module 1000 may define a plant growth habitat having an at least substantially rectangular shape, or a shape with a plurality of separate lobes (e.g., to form a star-shape, as shown in FIG. 5). In embodiments comprising separate lobes, the volume within each lobe may be separated from the remainder of the growth habitat, such that each lobe may be provided with a unique growth environment (e.g., different temperatures, carbon dioxide levels, humidity levels, and/or the like) to foster growth of different agricultural products.

Figure 6:
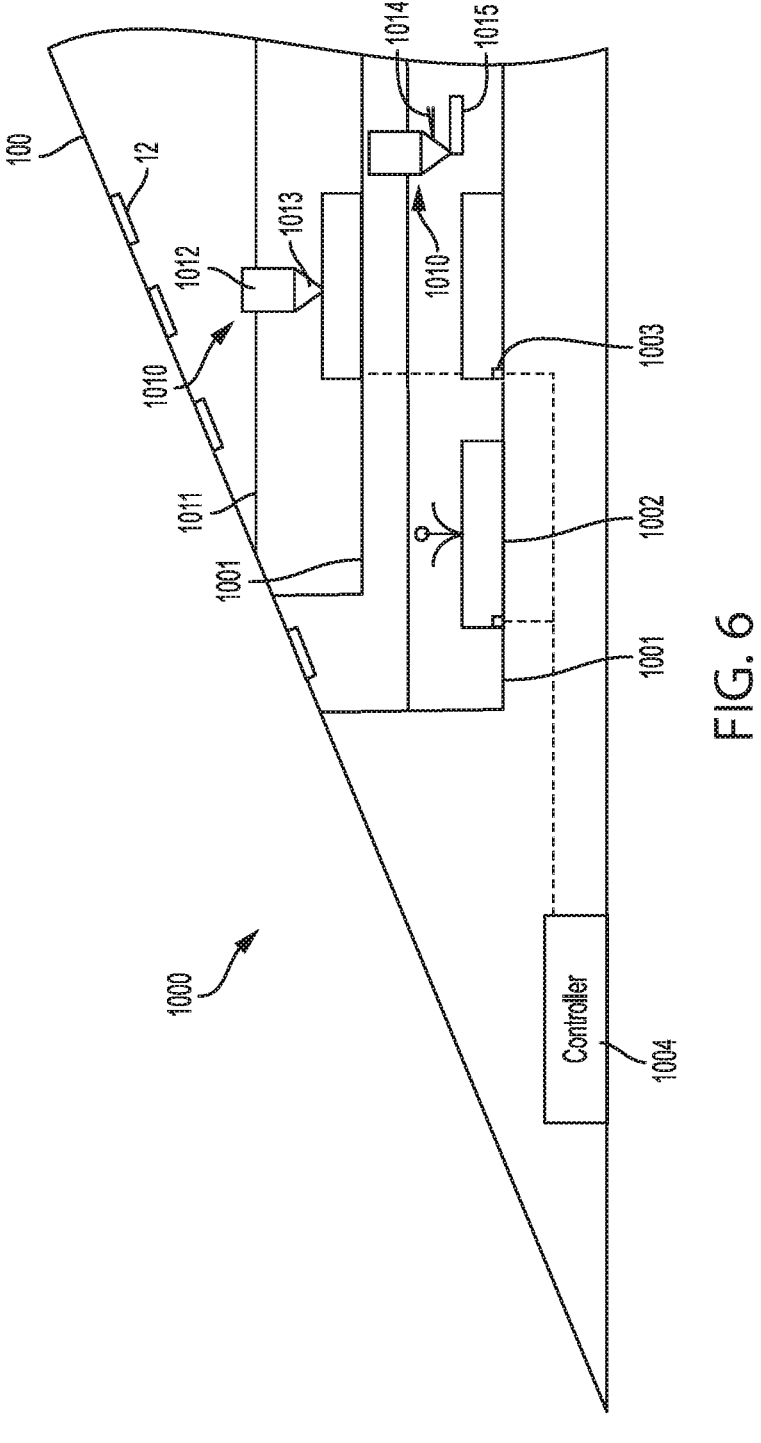
FIG. 6 illustrates an example growth habitat configuration according to one embodiment.

FIG. 6 shows a schematic detail view of a portion of a growth habitat of an agricultural module 1000 according to one embodiment. The growth habitat of the agricultural module 1000 may comprise one or more stackable structures 1001 each having one or more base portions 1002 configured to support a growth medium (e.g., soil, a hydroponic support, and/or the like) one or more sidewalls and a ceiling. The stackable structures 1001 may be suspended from support frames of the growth habitat, may be stacked such that the support of an upper structure is supported by a lower structure, and/or the like. The one or more sidewalls and ceiling are configured to contain the controlled atmospheric conditions within the structure (e.g., environmental air having controlled oxygen and carbon dioxide levels, controlled temperature, controlled humidity, and/or the like). The one or more sidewalls and ceiling may comprise a covering material, such as a flexible covering material, a rigid covering material, and/or the like. In certain embodiments, the covering material may comprise integrated growth lamps (e.g., light emitting diode growth lamps) and/or integrated electrical circuitry and/or may be configured to enable natural sunlight to pass through the covering material to the contained environment. In certain embodiments, the integrated growth lamps may be spaced at regular intervals throughout the flexible covering material, and may be electrically connected relative to one another and/or relative to one or more power sources via electrical circuitry. For example, in the illustrated embodiment of FIG. 6, the covering material comprises a solar canopy (e.g., solar canopy 100) as discussed herein, with integrated LEDs 12 spaced across the surface of the solar canopy.

In embodiments comprising flexible covering materials, the agricultural module may comprise one or more rigid supports collectively forming a rigid support frame for the flexible covering material.

In certain embodiments, the agricultural module 1000 may be embodied as a portable system that is configured to be quickly set up at a desired agricultural site. The agricultural module 1000 may additionally comprise one or more sensors 1003 that may be provided within the growth medium of the growth habitat. These sensors may be embodied as a portion of a flexible bundle of electrical circuitry, including conductors, sensors, and/or the like that may be quickly deployed within a growth habitat by unrolling the bundle onto a support surface of the growth habitat before providing the growth medium therein. In certain embodiments, the various sensors may be electrically connected relative to one another, relative to a control computing system 1004, and/or relative to a power source via one or more conductors (e.g., flexible conductors). The various sensors may comprise moisture sensors, temperature sensors, carbon dioxide content sensors, oxygen sensors, humidity sensors, and/or the like. It should be understood that certain of the described sensors may be configured for wireless data transmission to a control computing system via one or more wireless communication technologies, such as Wi-Fi, Bluetooth, Internet of Things (IoT) technologies, and/or the like.

In certain embodiments, sensor outputs (e.g., indicative of measured aspects of the environment within the growth habitat) may be utilized by the control computing system 1004 to regulate the environmental conditions within the growth habitat. For example, the control computing system 1004 may comprise data indicative of one or more target environmental conditions, such as a target temperature, target carbon dioxide content, and/or the like. Based on the monitored data output from the various sensors 1003 within the growth habitat, the control computing system 1004 is configured to compare the monitored data output against the target environmental conditions, and may be configured to adjust water flows, carbon dioxide flows, and/or the like from the AWG 100 into the growth habitat. For example, the control computing system 1004 may be configured to automatically activate sprinkler (or drip irrigation) systems (which may be incorporated into the stackable structures 1001) within the growth habitat to water the plants within the growth habitat in response to predetermined conditions; to increase and/or decrease the amount of carbon dioxide flowing into the growth habitat from carbon dioxide capture systems of the AWG system 110, and/or the like.

Moreover, the growth habitat may comprise one or more automated planting and harvesting mechanisms configured to autonomously plant seeds for new plants, and/or to automatically harvest fruits and/or vegetables grown within the growth habitat (this includes the use of agricultural robots and drones).

For example, seed planting/management may be provided via a planting probe 1010 operable to move along a grid/track system 1011 elevated above a support surface of the growth habitat. In certain embodiments, the grid/track system 1011 may be raised and/or lowered via a support mechanism (e.g., a pneumatic and/or hydraulic support mechanism). The planting probe 1010 may be operable in response to signals received from the control computing system 1004, which comprises data indicative of an internal mapping of the planting medium and/or base portions 1002 within the growth habitat. The control computing system 1004 additionally comprises data indicative of a desired crop, crop spacing, and/or the like for planting within the growth habitat, and may provide movement signals to the planting probe 1010 to insert seeds into the planting medium according to a desired planting plan.

The planting probe 1010 itself may comprise a hopper 1012 configured to hold a volume of seed, and an insertion probe 1013 (e.g., a wedge shaped insertion probe) configured to inject seed at an appropriate depth within the planting medium (as determined by the control computing system 1004). The planting probe 1010 additionally comprises a movement mechanism (e.g., one or more motors) configured to move the planting probe 1010 along the track/grid to plant seeds within the planting medium. Moreover, the planting probe 1010 may be configured to periodically return to a refill position within the growth habitat to retrieve additional seed within the included hopper 1012. The refill position may be positioned within the growth habitat, proximate a fill chute containing additional seed that may be selectively provided to the planting probe 1010 as needed. In certain embodiments, the fill chute may be embodied as a container supported (e.g., suspended) above the movement path of the planting probe, such that the planting probe 1010 may move below the fill chute to be refilled by gravitational force moving the seed from the fill chute into the planting probe 1010. Moreover, in certain embodiments the fill chute may comprise an actuatable feed door (e.g., a servo-actuated feed door) configured to open and allow a flow of seed out of the feed chute in response to a signal received from the control computing system 1004. Thus, when the planting probe 1010 is positioned beneath the feed chute, the control computing system 1004 may be configured to open the feed door to enable seed to flow from the feed chute to the planting probe 1010. Once an appropriate amount of seed has been provided to the planting probe 1010, the control computing system 1004 may transmit a second signal causing the feed door to close.

The planting probe 1010 may additionally comprise a harvesting mechanism that may be detachably secured relative to the movable planting probe 1010. The harvesting mechanism may comprise a mechanically movable cutting/picking arm 1014 and a holding basket/tray 1015. Once the planting probe 1010 receives signals from the control computing system 1004 to initiate the harvest process, the planting probe 1010 may process to pick and/or cut produce/plants from the various plants within the growth habitat, and to deposit the cut produce/plants into the holding basket/tray 1015. Once the holding basket/tray 1015 is full, the planting probe 1010 may return to a docking position, where the holding basket/tray 1015 may deposit the harvested items into a retention crate that may be removed from the growth habitat. Moreover, in certain embodiments the retention crate may comprise one or more level sensors configured to monitor the amount of harvested items within the retention crate to avoid the retention crate from overflowing. Upon detecting that the retention crate fill level is above a threshold level, the control computing system 1004 may be configured to transmit a signal to the planting probe 1010 to suspend harvesting operations until the retention crate is emptied.

Although described above in reference to a track-based planting and harvesting probe configuration, various embodiments may be configured to plant seeds and/or harvest produce via an unmanned aerial vehicle (UAV) comprising a planting probe and/or a harvesting probe having a configuration similar to that described above. The UAV may be autonomous and may be configured to navigate the interior of the growth habitat according to a defined planting plan. In certain embodiments, the planting plan may define a map of locations of intended seed plantings, such that the autonomous UAV may be configured to autonomously navigate between the plurality of intended seed planting locations to deposit seeds within the growth medium.

The autonomous UAV may additionally comprise a harvesting probe configuration similar to that described herein. The UAV with the harvesting probe configuration may be configured to autonomously navigate the interior of the growth habitat to harvest produce grown therein.

The irrigation system of the growth habitat may be embodied as one or more tubes that may be connected to water distribution mechanisms, such as spraying-style sprinklers, drip-irrigation tubes, and/or the like. The tubes may comprise a plastic, flexible tubing and may be embodied as a self-healing material configured to self-seal cracks, cuts, and/or punctures through the tube walls. These tubes may be connected to a water outlet of a condensation system of the AWG system, a water holding tank of the AWG system, and/or the like.

Moreover, the irrigation system may comprise a fertilizer supply mechanism configured to automatically mix a metered quantity of fertilizer (e.g., a liquid fertilizer) into water supplied to the irrigation system. The fertilizer supply mechanism may be in electronic communication with the control computing system 1004, which may be configured to provide signals to the fertilizer supply mechanism to modify the amount of liquid fertilizer introduced into the water stream.

Example Operation of an Atmospheric Air Generation System

The following discussion provides an example operation of the operation of an embodiment utilizing a membrane-based water extraction process as a part of an atmospheric water generation system and method. It should be noted that recitation of the term "about" with reference to a numerical value (e.g., a temperature value, a pressure value, and/or the like) encompasses both the value itself as well as deviations from the value that provide the same functional operation of the methodology in which the value is recited. For example, a recitation of a temperature range between "about" 10° F. to "about" 50° F. is intended to encompass a temperature range between 10° F. to 50° F., as well as slight deviations in the upper and lower bounds of the temperature range that provide the same functionality as the recited temperature range. Moreover, the concepts discussed herein may be utilized with any of a variety of desiccant fluids, gels, aerogels, and/or the like, as the described process is not dependent on the desiccant utilized. Any one of a plurality of desiccant fluids may be utilized, including the non-limiting examples of $CaCl_2$), NaCl, LiCl, KCOOH, $MgCl_2$, Ionic liquids, Deep Eutectic Solvent, Organic Liquids and/or any combination thereof.

As an example operation, a desiccant fluid exits the absorber at a concentration between about 10% and about 50% by weight percent, and a temperature between about 75° F. and about 130° F. The desiccant fluid flows along a flow path (using one or more pumps, as needed) through one or more heating mechanisms, such as a condenser (utilizing the relatively cool temperature of the dilute desiccant on a first side of the condenser to condense water vapor flowing within a water flow path as discussed in greater detail herein, wherein the water flow path flows on an opposite side of the heat exchanger embodied as the condenser). Water vapor condenses in the condenser as it traverses through the condenser as it warms the dilute desiccant fluid. In another embodiment, the condenser is a double pipe heat exchanger where the dilute desiccant fluid enters the double pipe heat exchanger through the inner pipe. Water vapor enters the heat exchanger via the outer pipe. Water vapor condenses on the exterior surface of the inner pipe as it traverses through the condenser.

In certain embodiments, the flow pattern through the condenser is in a counter current orientation with the dilute desiccant solution flowing in a first direction and the water flow path flowing in an opposite second direction through the heat exchanger (as mentioned, the dilute desiccant fluid is physically separated from the water flow path within the condenser). In other embodiments flow patterns through the condenser are in the co-current orientation depending on the shape and orientation of the heat exchanger embodying the condenser.

Upon exiting the condenser, the dilute desiccant fluid temperature is between about 132° F. and about 170° F. The dilute desiccant fluid is then sent to a second heat exchanger 629 where sensible heat transfer from rich desiccant fluid exiting the membrane-based water extraction device further heats the dilute desiccant fluid. In certain embodiments the second heat exchanger is a shell-and-tube heat exchanger with the dilute desiccant fluid entering on the tube side of the second heat exchanger. Rich desiccant fluid enters the shell side of the second heat exchanger. In another embodiment, the dilute desiccant fluid enters the shell side of the second heat exchanger, and the rich desiccant fluid enters the tube side of the second heat exchanger. In another embodiment the second heat exchanger is a plate and frame heat exchanger. Dilute desiccant fluid enters one set of plates while rich desiccant fluid enters the other set of plates. In another embodiment the second heat exchanger is a double pipe heat exchanger where the dilute desiccant fluid enters the double pipe heat exchanger via the inner pipe and rich desiccant fluid enters the heat exchanger via the outer pipe.

The dilute desiccant fluid exits the second heat exchanger at a temperature of between about 140° F. and about 210° F. The dilute desiccant fluid then traverses through a heater. The heater may be an inline electric heater with element bundles for heating the fluid. The heater may have different orientations to reduce the likelihood of fluid flashing on the elements. In certain embodiments, the heater may reside in the membrane-based water extraction device housing. In certain embodiments the heater is a heat exchanger of the shell-and-tube or plate-and-frame type. In certain embodiments the heater is a solar heater utilizing photovoltaic panels to generate energy through electricity from solar capture. In certain embodiments, the heater is a frenal lens utilizing solar energy to generate thermal energy in the form of heat. In certain embodiments the heater is a geothermal heater as discussed herein. In certain embodiments the heater is a fired heater utilizing a hydrocarbon fuel source combined with oxygen to create heat from combustion. In certain embodiments, the oxygen is used from the ambient air. Upon exiting the heater, the dilute desiccant fluid is at a temperature of between about 150° F. and about 270° F.

The dilute desiccant fluid then flows into to membrane-based water extraction device. In certain embodiments, a reducing orifice is provided at the exit of the membrane-based water extraction device to increase the pressure on the desiccant side of the membrane within the housing of the membrane-based water extraction device.

The dilute desiccant flow flows into the housing of the membrane-based water extraction device, on a first side of the membrane. The dilute desiccant flow is at a high temperature (e.g., between about 150° F. and about 270° F.) and a high pressure. A water flow passes on an opposite, second side of the membrane as it flows along a water flow path. The water flow path may pass through a reducing orifice at the entry to the membrane-based water extraction device to reduce the pressure on the water flow side of the membrane to encourage water to pass through the membrane to the water flow side of the membrane. Moreover, the water flow passes through a chiller prior to entry into the housing of the membrane-based water extraction device.

As the diluted desiccant and the water flow through the housing of the membrane-based water extraction device on opposite sides of the membrane, water absorbed within the fluid desiccant migrates through the membrane (it is believed that the water enters the membrane on the desiccant side of the membrane as a liquid, and exits the membrane on the water side of the membrane as a vapor). This reconcentrates the desiccant fluid, while capturing water vapor within the permeate water flow path for later condensation and storage for use as liquid water. The reconcentrated desiccant fluid them flows back to the absorber (e.g., passing through one or more heat exchangers for sensible heat transfer to the dilute desiccant solution as discussed above) by passing through one or more chiller devices to cool the temperature of the desiccant fluid prior to entry into the absorber. The entire flow path of the desiccant is a closed desiccant circulation loop configured for negligible mass transfer of desiccant salt through the membrane of the membrane-based water extraction device and/or into atmospheric air contacting the desiccant flow within the absorber. As the desiccant flows along the flow paths within the closed desiccant circulation loop, water is absorbed into the desiccant and/or extracted from the desiccant as the desiccant flows through the AWG system.

The water flow path exiting the membrane-based water extraction device passes out of the membrane-based water extraction device and passes through one or more condensers. In certain embodiments, a sweep gas (e.g., a gas having characteristics to lower the possibility of water evaporation into the gas and/or a high-humidity air flowing along a closed-air circulation loop coextensive with the water flow path) flows with the liquid water so as to flow the water vapor out of the membrane-based water extraction device and to the condensers. In certain embodiments, the water flow passes through a compressor to increase the pressure of the water flow (thereby increasing the vapor pressure of the water vapor to encourage condensation) prior to passing the water flow through the one or more condensers. After the water flow path passes through the condenser, the water flow path passes into a storage tank. Certain amounts of water from the storge tank recirculate through the water flow path (to the membrane-based water extraction device) to encourage extraction of additional water from dilute desiccant fluid flowing through the membrane-based water extraction device.

CONCLUSION

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A surface covering comprising:
a plurality of solar canopy regions, each solar canopy region comprising:
a first film layer;
a second film layer secured relative to the first film layer, wherein the first film layer and the second film layer define an enclosed region therebetween;
an opacity-tunable fluid disposed within the enclosed region;
an electrical layer; and
a first flexible protective sheet secured relative to a first side defined by the first film layer, wherein the electrical layer is positioned between the first side defined by the first film layer and the first flexible protective sheet, and wherein the first flexible protective sheet comprises reflective material configured to focus light on the electrical layer; and
one or more controllers configured for independently varying opacity of each solar canopy region between a minimum opacity level and a maximum opacity level by applying a signal to the opacity-tunable fluid disposed within at least one of the plurality of solar canopy regions to cause the opacity of the surface covering to be independently varied at each of the solar canopy regions to an opacity level between the minimum opacity level and the maximum opacity level.

2. The surface covering of claim 1, wherein the signal is selected from the group consisting of electric field, temperature, fluid concentration, light, and magnetic field.

3. The surface covering of claim 1, wherein the opacity-tunable fluid comprises a plurality of liquid crystals having dispersed molecules that are orientable in response to applying an electric signal to the opacity-tunable fluid.

4. The surface covering of claim 3, wherein the plurality of liquid crystals comprises one or more of rigid-rod polymers, nanowires, nanorods, disc-shaped molecules, nanofibers, and biomolecules.

5. The surface covering of claim 1, wherein each solar canopy region is substantially flexible.

6. The surface covering of claim 1, wherein each solar canopy region further comprises one or more attachment members configured to secure the solar canopy region relative to a support frame of a greenhouse.

7. The surface covering of claim 1, wherein the electrical layer comprises a plurality of photovoltaic elements forming a photovoltaic array.

8. The surface covering of claim 7, wherein the plurality of photovoltaic elements are connected within a circuit and arranged in parallel.

9. The surface covering of claim 7, wherein the photovoltaic array is flexible.

10. The surface covering of claim 7, wherein each solar canopy region further comprises a plurality of light emitting diode (LED) elements forming an LED array, and wherein:
the LED array is positioned proximate to a second side defined by the second film layer of the solar canopy region and is configured to emit light through an inner side of the solar canopy region; and
the plurality of LED elements receive electrical power from the plurality of photovoltaic elements.

11. The surface covering of claim 10, further comprising:
for each solar canopy region:
a second flexible protective sheet spaced apart from the first flexible protective sheet and secured relative to the second side defined by the second film layer, wherein the LED array is positioned between the second side defined by the second film layer and the second flexible protective sheet.

12. The surface covering of claim 1, wherein the surface covering defines an enclosure of a greenhouse, and wherein the greenhouse additionally comprises an atmospheric water generation system comprising:
an absorber configured to intersect an atmospheric air stream with a desiccant flowing along a closed desiccant circulation loop to extract water vapor from the atmospheric air stream and to absorb the water vapor into the desiccant;
at least one membrane-based water extraction device configured to extract water from the desiccant for collection within a permeate water flow path; and
at least one heating mechanism to raise a temperature of the desiccant prior to entering the at least one membrane-based water extraction device.

13. An electrical energy generation and storage system, the electrical energy generation and storage system comprising:
a surface covering comprising:
a plurality of solar canopy regions, each solar canopy region comprising:
a first film layer;
a second film layer secured relative to the first film layer, wherein the first film layer and the second film layer define an enclosed region therebetween;
an opacity-tunable fluid disposed within the enclosed region;
an electrical layer; and
a first flexible protective sheet secured relative to a first side defined by the first film layer, wherein the electrical layer is positioned between the first side defined by the first film layer and the first flexible protective sheet, and wherein the first flexible protective sheet comprises reflective material configured to focus light on the electrical layer; and one or more controllers configured for independently varying opacity of each solar canopy region between a minimum opacity level and a maximum opacity level by applying a signal to the opacity-tunable fluid disposed within at least one of the plurality of solar canopy regions to cause the opacity of the surface covering to be independently varied at each of the solar canopy regions to an opacity level between the minimum opacity level and the maximum opacity level;

a plurality of photovoltaic elements forming a plurality of photovoltaic arrays, wherein the electrical layer of each solar canopy region comprises a photovoltaic array of the plurality of photovoltaic arrays, and wherein each photovoltaic array is configured to collect sunlight and to convert the sunlight into electrical energy; and one or more electrical connectors extending beyond the surface covering; and one or more batteries in electrical connection with the surface covering via at least the one or more electrical connectors, wherein the one or more batteries are configured to store at least a portion of the electrical energy.

14. The electrical energy generation and storage system of claim 13, wherein each solar canopy region further comprises a plurality of light emitting diode (LED) elements forming an LED array, and wherein:

the LED array is positioned proximate to a second side defined by the second film layer of the solar canopy region and is configured to emit light through an inner side of the solar canopy region; and the plurality of LED elements receive electrical power from the plurality of photovoltaic elements.

15. The electrical energy generation and storage system of claim 14, wherein the LED array comprises a plurality of LEDs connected within a circuit and arranged in parallel.

16. The electrical energy generation and storage system of claim 15, wherein the LED array is substantially flexible.

17. The electrical energy generation and storage system of claim 13, wherein each photovoltaic array is flexible.

18. The electrical energy generation and storage system of claim 13, wherein the plurality of photovoltaic elements are connected within a circuit and arranged in parallel.

19. The electrical energy generation and storage system of claim 13, wherein the surface covering further comprises one or more attachment members configured to secure the surface covering relative to a support frame of a greenhouse.

20. The electrical energy generation and storage system of claim 13, wherein the electrical energy generation and storage system is utilized in an atmospheric water generation system comprising:

an absorber configured to intersect an atmospheric air stream with a desiccant flowing along a closed desiccant circulation loop to extract water vapor from the atmospheric air stream and to absorb the water vapor into the desiccant; and at least one membrane-based water extraction device configured to extract water from the desiccant for collection within a permeate water flow path, wherein the at least one membrane-based water extraction device comprises:

a housing supporting a porous membrane separating a desiccant flow path from the permeate water flow path, wherein the porous membrane permits water vapor to pass through the porous membrane from the desiccant flow path to the permeate water flow path; and at least one heating mechanism to raise a temperature of the desiccant prior to entering the at least one membrane-based water extraction device.

\* \* \* \* \*